(12) United States Patent
Hasegawa et al.

(10) Patent No.: US 11,430,798 B2
(45) Date of Patent: *Aug. 30, 2022

(54) METHODS AND APPARATUSES WITH VERTICAL STRINGS OF MEMORY CELLS AND SUPPORT CIRCUITRY

(71) Applicant: Micron Technology, Inc., Boise, ID (US)

(72) Inventors: Takehiro Hasegawa, Yokohama (JP); Koji Sakui, Setagayaku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/164,375

(22) Filed: Feb. 1, 2021

(65) Prior Publication Data

US 2021/0265370 A1 Aug. 26, 2021

Related U.S. Application Data

(60) Continuation of application No. 16/418,743, filed on May 21, 2019, now Pat. No. 10,910,389, which is a
(Continued)

(51) Int. Cl.
*H01L 29/76* (2006.01)
*H01L 27/11531* (2017.01)
(Continued)

(52) U.S. Cl.
CPC .... *H01L 27/11531* (2013.01); *G11C 16/0483* (2013.01); *H01L 27/0694* (2013.01);
(Continued)

(58) Field of Classification Search
CPC ......... H01L 27/11531; H01L 29/40114; H01L 29/40117; H01L 27/0694; H01L 27/115;
(Continued)

(56) References Cited

U.S. PATENT DOCUMENTS 6,031,764 A 2/2000 Imamiya et al.
7,618,870 B2 11/2009 Pan et al.
(Continued)

FOREIGN PATENT DOCUMENTS

CN 101208795 A 6/2008
CN 106104693 A 11/2016
(Continued)

OTHER PUBLICATIONS

"Chinese Application Serial No. 201580011706.0, Office Action dated Jan. 25, 2018", w/English Translation, 12 pgs.
(Continued)

*Primary Examiner* — Huan Hoang
(74) *Attorney, Agent, or Firm* — Schwegman Lundberg & Woessner, P.A.

(57) ABSTRACT

Apparatuses and methods have been disclosed. One such apparatus includes strings of memory cells formed on a topside of a substrate. Support circuitry is formed on the backside of the substrate and coupled to the strings of memory cells through vertical interconnects in the substrate. The vertical interconnects can be transistors, such as surround substrate transistors and/or surround gate transistors.

20 Claims, 40 Drawing Sheets

Related U.S. Application Data continuation of application No. 15/011,819, filed on Feb. 1, 2016, now Pat. No. 10,319,729, and a division of application No. 14/161,170, filed on Jan. 22, 2014, now Pat. No. 9,252,148.

(51) Int. Cl.

| | |
|---|---|
| H01L 29/78 | (2006.01) |
| H01L 29/66 | (2006.01) |
| H01L 27/115 | (2017.01) |
| H01L 21/28 | (2006.01) |
| G11C 16/04 | (2006.01) |
| H01L 27/06 | (2006.01) |
| H01L 27/11546 | (2017.01) |
| H01L 27/11556 | (2017.01) |
| H01L 27/11573 | (2017.01) |
| H01L 27/11582 | (2017.01) |
| G11C 5/14 | (2006.01) |

(52) U.S. Cl.
CPC ...... *H01L 27/115* (2013.01); *H01L 27/11546* (2013.01); *H01L 27/11556* (2013.01); *H01L 27/11573* (2013.01); *H01L 27/11582* (2013.01); *H01L 29/40114* (2019.08); *H01L 29/40117* (2019.08); *H01L 29/66477* (2013.01); *H01L 29/78* (2013.01); *G11C 5/145* (2013.01)

(58) Field of Classification Search
CPC ......... H01L 27/11546; H01L 27/11573; G11C 16/4083; G11C 5/145
USPC ..................................... 257/314; 365/185.17
See application file for complete search history.

(56) References Cited

U.S. PATENT DOCUMENTS

| | | | |
|---|---|---|---|
| 7,902,643 | B2 | 3/2011 | Tuttle |
| 8,101,438 | B2 | 1/2012 | McAvoy et al. |
| 8,456,856 | B2 | 6/2013 | Lin et al. |
| 8,519,516 | B1 | 8/2013 | Gandhi |
| 9,252,148 | B2 | 2/2016 | Hasegawa et al. |
| 10,319,729 | B2 | 6/2019 | Hasegawa et al. |
| 10,910,389 | B2 | 2/2021 | Hasegawa et al. |
| 2002/0108017 | A1 | 8/2002 | Kenchammana-hoskote et al. |
| 2007/0161235 | A1 | 7/2007 | Trezza |
| 2007/0205445 | A1 | 9/2007 | Park et al. |
| 2008/0077736 | A1 | 3/2008 | Mukherjee et al. |
| 2008/0109424 | A1 | 5/2008 | Day et al. |
| 2008/0173932 | A1 | 7/2008 | Kidoh et al. |
| 2008/0283873 | A1 | 11/2008 | Yang et al. |
| 2009/0097321 | A1 | 4/2009 | Kim et al. |
| 2009/0224309 | A1 | 9/2009 | Kidoh et al. |
| 2010/0090286 | A1 | 4/2010 | Lee et al. |
| 2010/0157644 | A1 | 6/2010 | Norman et al. |
| 2011/0019480 | A1 | 1/2011 | Kito et al. |
| 2011/0092030 | A1 | 4/2011 | Or-Bach et al. |
| 2011/0169071 | A1 | 7/2011 | Uenaka et al. |
| 2011/0267092 | A1 | 11/2011 | Hargan et al. |
| 2012/0018885 | A1 | 1/2012 | Lee et al. |
| 2012/0170365 | A1 | 7/2012 | Kang et al. |
| 2012/0203761 | A1 | 8/2012 | Biran et al. |
| 2013/0141861 | A1 | 6/2013 | Lin et al. |
| 2013/0173655 | A1 | 7/2013 | Hoots, III et al. |
| 2013/0187219 | A1 | 7/2013 | Parthasarathy et al. |
| 2013/0193488 | A1 | 8/2013 | Or-Bach et al. |
| 2013/0223149 | A1 | 8/2013 | Kito et al. |
| 2013/0228843 | A1 | 9/2013 | Lim et al. |
| 2014/0169105 | A1 | 6/2014 | Oh |
| 2015/0060971 | A1* | 3/2015 | Fujii ................. H01L 27/11536 257/300 |
| 2015/0206587 | A1 | 7/2015 | Hasegawa et al. |
| 2016/0148943 | A1 | 5/2016 | Hasegawa et al. |
| 2019/0341394 | A1 | 11/2019 | Hasegawa et al. |

FOREIGN PATENT DOCUMENTS

| | | |
|---|---|---|
| CN | 106104693 B | 7/2019 |
| CN | 110400589 A | 11/2019 |
| EP | 3097561 A1 | 11/2016 |
| JP | 04273575 | 9/1992 |
| JP | 09204355 A | 8/1997 |
| JP | 2003229494 A | 8/2003 |
| JP | 2004140133 A | 5/2004 |
| JP | 2009146942 A | 7/2009 |
| JP | 02194560 A | 8/2009 |
| JP | 2009232903 A | 10/2009 |
| JP | 2011204829 A | 10/2011 |
| JP | 2012159903 A | 8/2012 |
| JP | 2013089282 A | 5/2013 |
| JP | 6367956 B2 | 7/2018 |
| KR | 20080100649 A | 11/2008 |
| KR | 20090037690 A | 4/2009 |
| KR | 20100137344 A | 12/2010 |
| KR | 20120079202 A | 7/2012 |
| KR | 20130100459 A | 9/2013 |
| KR | 102193562 B1 | 12/2020 |
| WO | WO-2015112557 A1 | 7/2015 |

OTHER PUBLICATIONS

"Chinese Application Serial No. 201580011706.0, Office Action dated Sep. 27, 2018", W/English Translation, 8 pgs.

"Chinese Application Serial No. 201580011706.0, Response filed Jun. 11, 2018 to Office Action dated Jan. 25, 18", w/English Claims, 13 pgs.

"Chinese Application Serial No. 201580011706.0, Response filed Dec. 4, 2018 to Office Action dated Sep. 27, 2018", w/English Claims, 12 pgs.

"Chinese Application Serial No. 201910599243.4, Voluntary Amendment Filed Oct. 1, 2019", w/English Claims, 19 pgs.

"European Application Serial No. 15740682.8, Communication Pursuant to Article 94(3) EPC dated Sep. 18, 2020", 5 pgs.

"European Application Serial No. 15740682.8, Extended European Search Report dated Dec. 5, 2017", 14 pgs.

"European Application Serial No. 15740682.8, Partial Supplementary European Search Report dated Aug. 2, 2017", 14 pgs.

"European Application Serial No. 15740682.8, Response filed Mar. 29, 2021 to Communication Pursuant to Article 94(3) EPC dated Sep. 18, 2020", 84 pgs.

"International Application Serial No. PCT/US2015/012185, International Preliminary Report on Patentability dated Aug. 4, 2016", 8 pgs.

"International Application Serial No. PCT/US2015/012185, International Search Report dated Mar. 25, 2015", 7 pgs.

"International Application Serial No. PCT/US2015/012185, Written Opinion dated Mar. 25, 2015", 6 pgs.

"Japanese Application Serial No. 2016-548071, Office Action dated Jan. 9, 2018", w/English Translation, (dated Jan. 9, 2018), 8 pgs.

"Japanese Application Serial No. 2016-548071, Office Action dated Aug. 29, 2017", w/English Translation, 8 pgs.

"Japanese Application Serial No. 2016-548071, Response filed Feb. 8, 2018 to Office Action dated Jan. 9, 2018", w/English Claims, 11 pgs.

"Japanese Application Serial No. 2016-548071, Response filed Sep. 22, 2017 to Office Action dated Aug. 29, 2017", w/English Claims, 16 pgs.

"Korean Application Serial No. 10-2016-7022761, Final Office Action dated Jun. 21, 2018", w/English Translation, 7 pgs.

"Korean Application Serial No. 10-2016-7022761, Notice of Preliminary Rejection dated Dec. 12, 2017", w/English Translation, 11 pgs.

"Korean Application Serial No. 10-2016-7022761, Response filed Feb. 14, 2018 to Notice of Preliminary Rejection dated Dec. 12, 2017", w/English Claims, 31 pgs.

(56) References Cited

OTHER PUBLICATIONS

"Korean Application Serial No. 10-2016-7022761, Response filed Sep. 19, 2018 to Final Office Action dated Jun. 21, 2018", w/English Claims, 21 pgs.

"Korean Application Serial No. 10-2018-7027206, Notice of Preliminary Rejection dated Apr. 20, 2020", w/English Translation, 7 pgs.

"Korean Application Serial No. 10-2018-7027206, Response filed Aug. 20, 2020 to Notice of Preliminary Rejection dated Apr. 20, 2020", w/English Claims, 24 pgs.

Sakui, Koji, et al., "A High Efficient, Low Power, and Compact", ISDRS, (2009), 2 pgs.

Sakui, Koji, et al., "A high efficient, low power, and compact charge pump by vertical MOSFETs", Solid-State Electronics 54, (2010), 1192-1196.

Sakui, Koji, et al., "Design Impacts on NAND Flash Memory Core Circuits with Vertical MOSFETs", IEEE 978-1-4244-7668-8Z10, Center for Interdisciplinary Research, Tohoku University, JST-CREST, (2010), 84-87.

\* cited by examiner

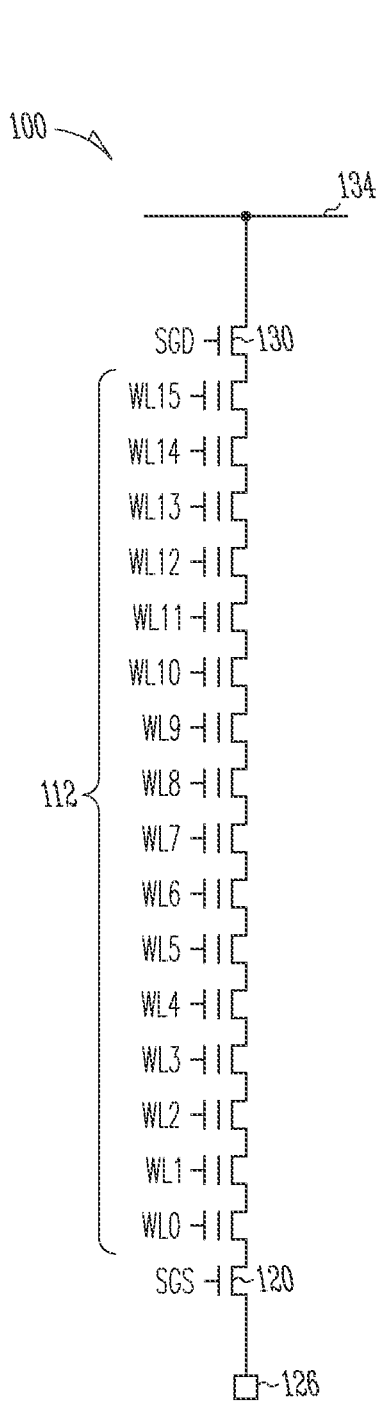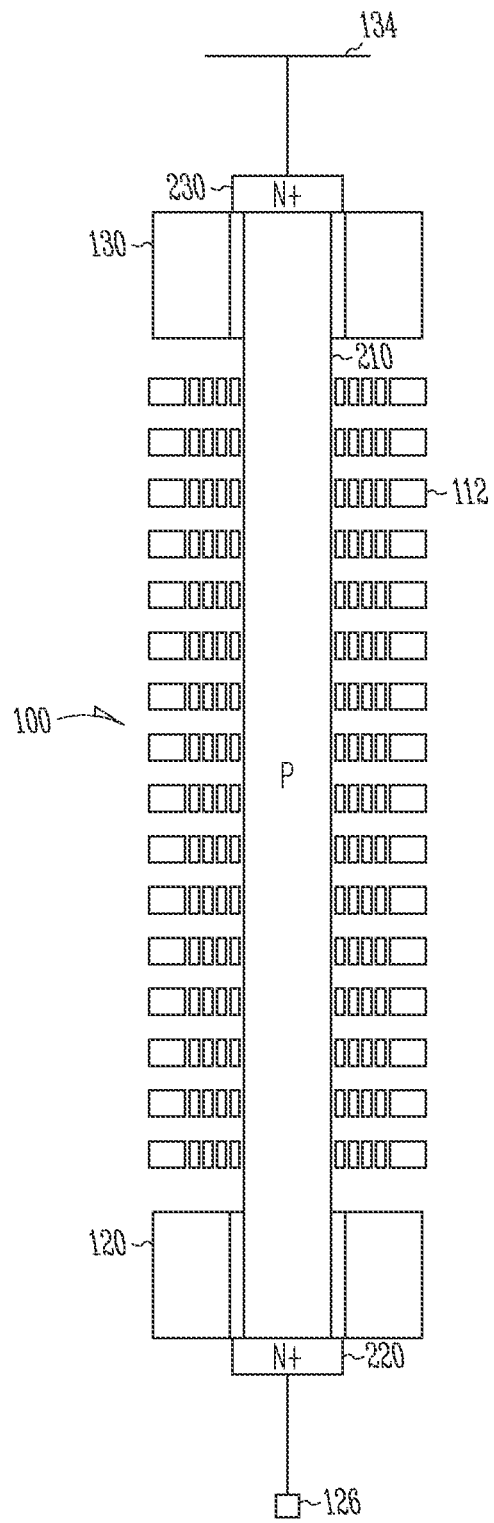
Fig.1
Fig.2

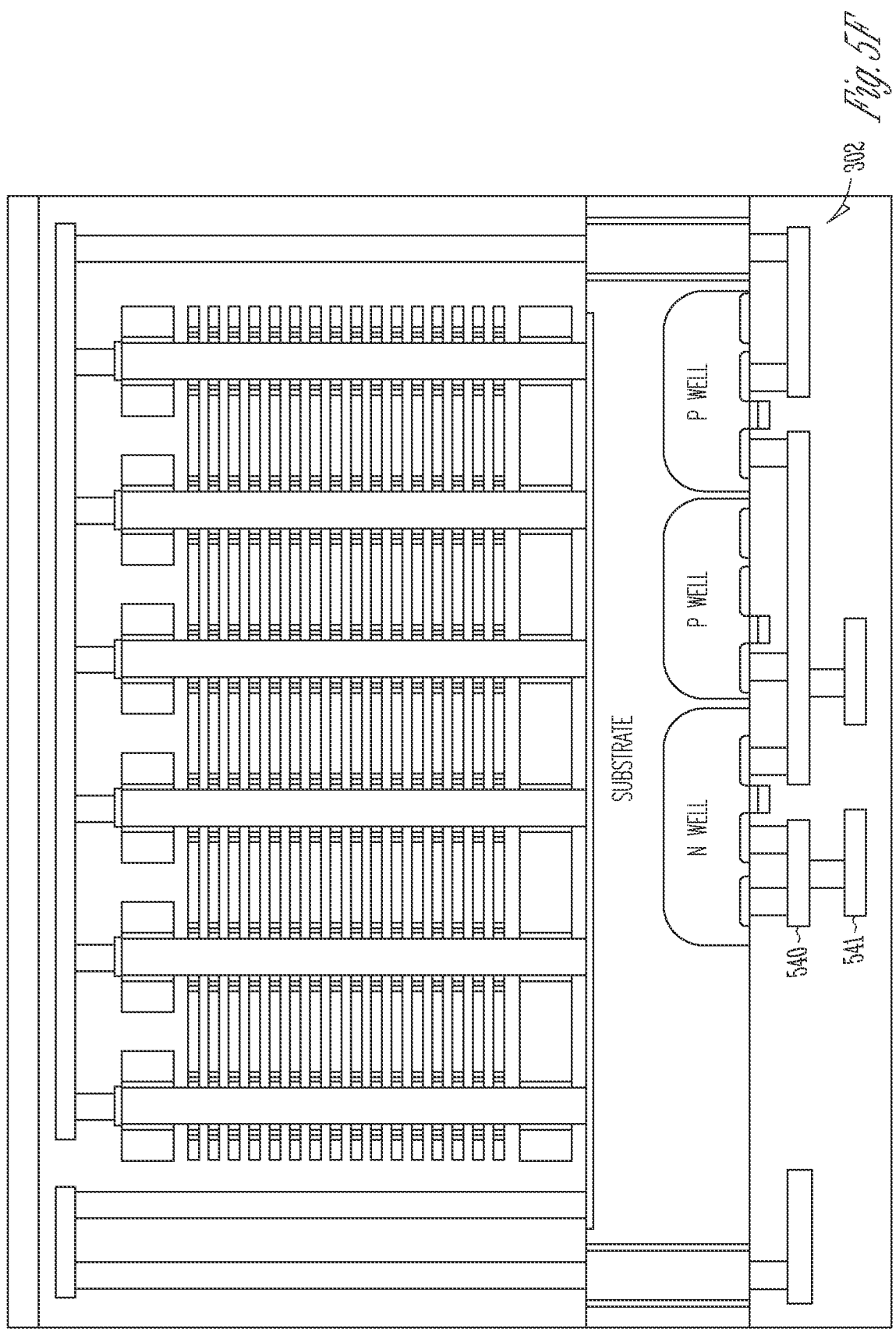

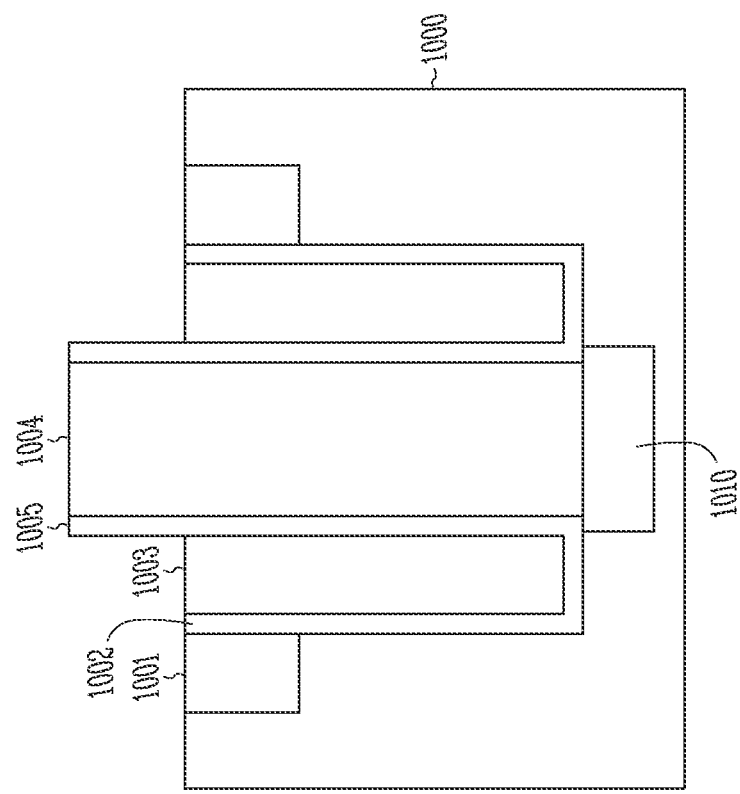
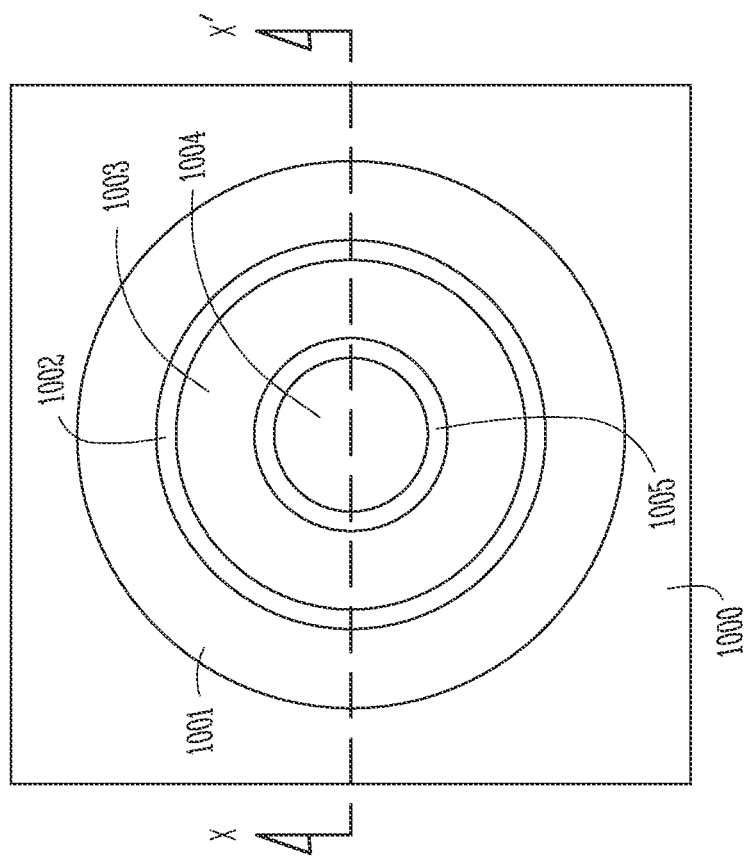

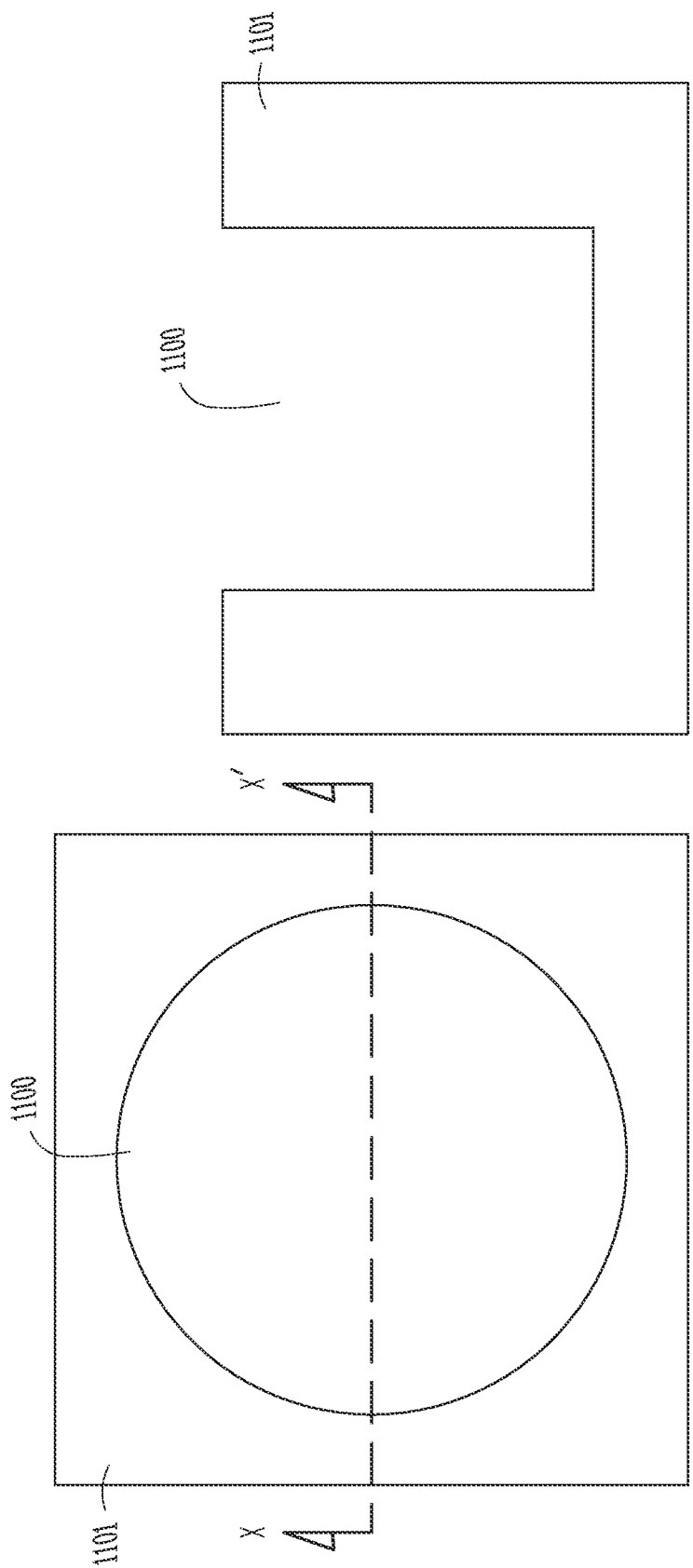

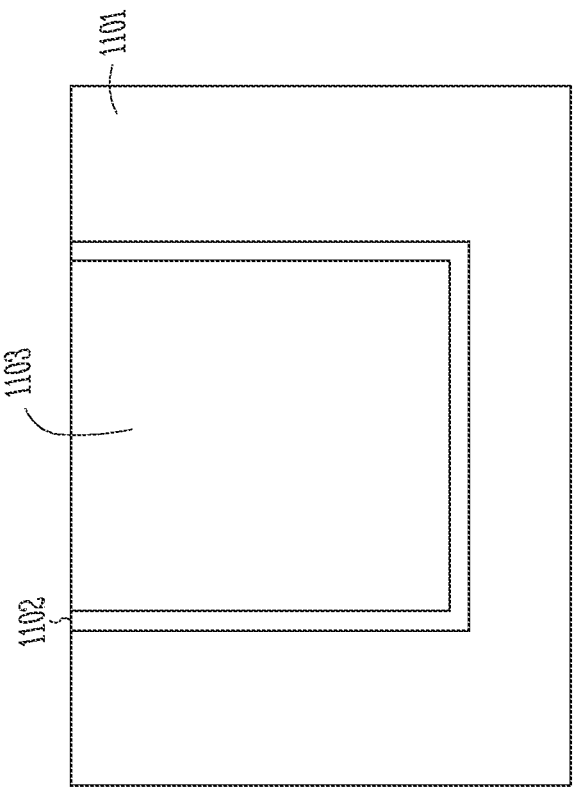
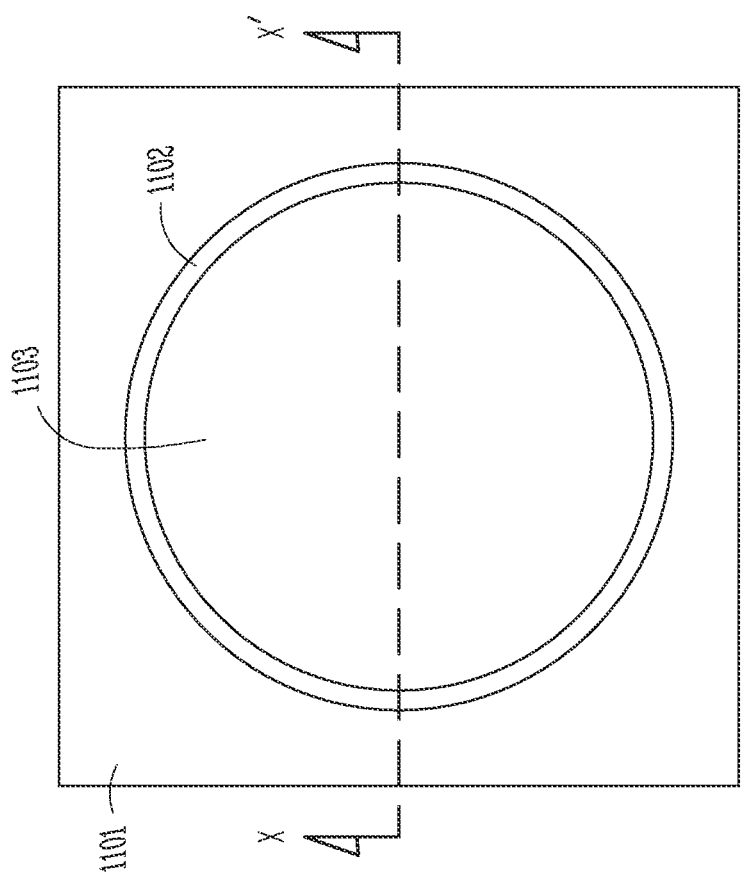

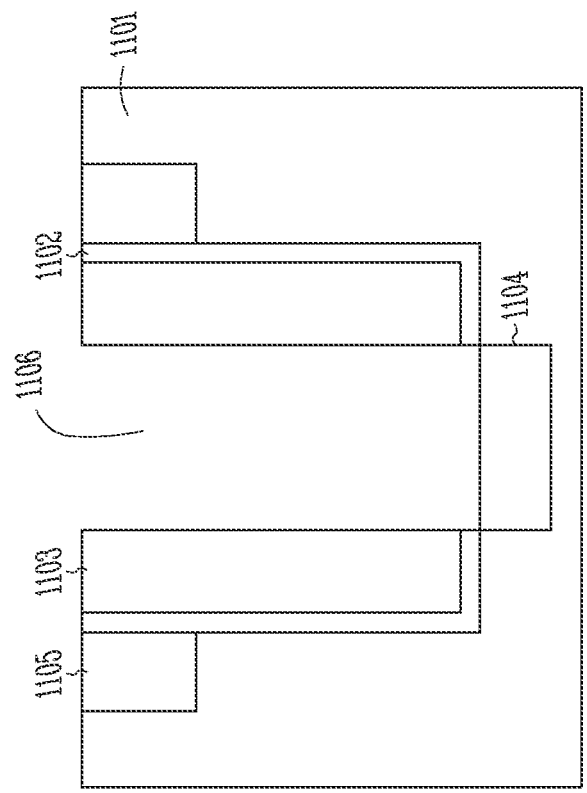
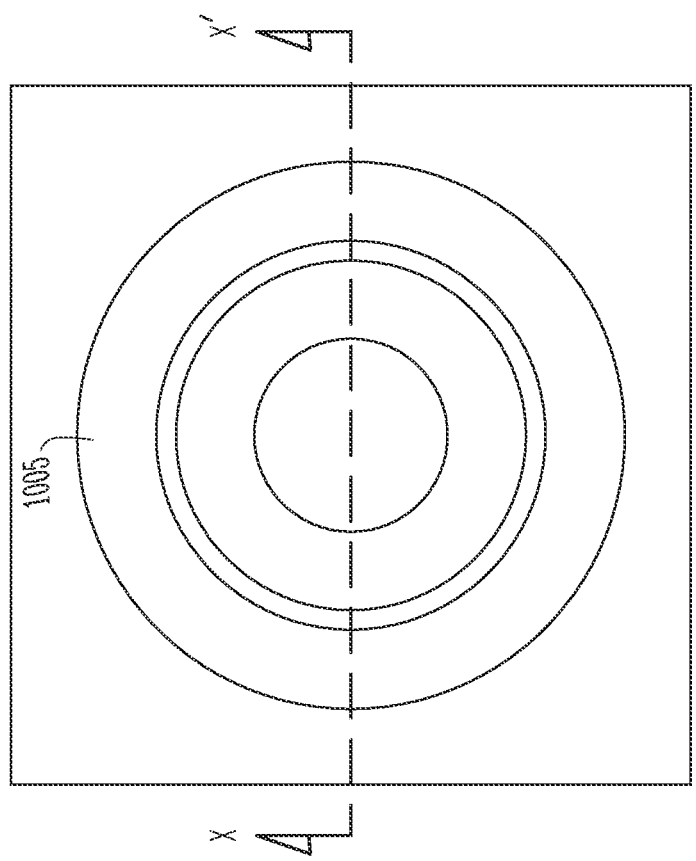
Fig. 11F
Fig. 11E

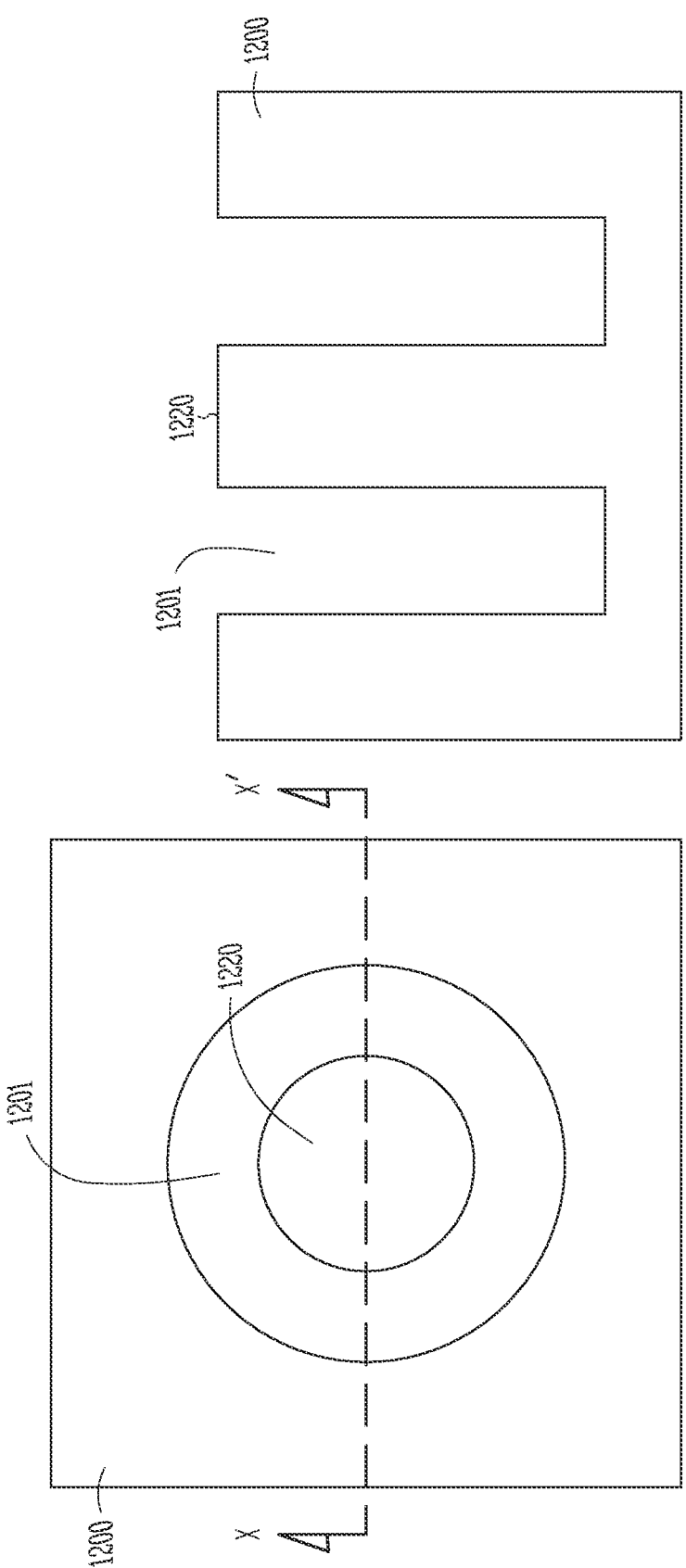

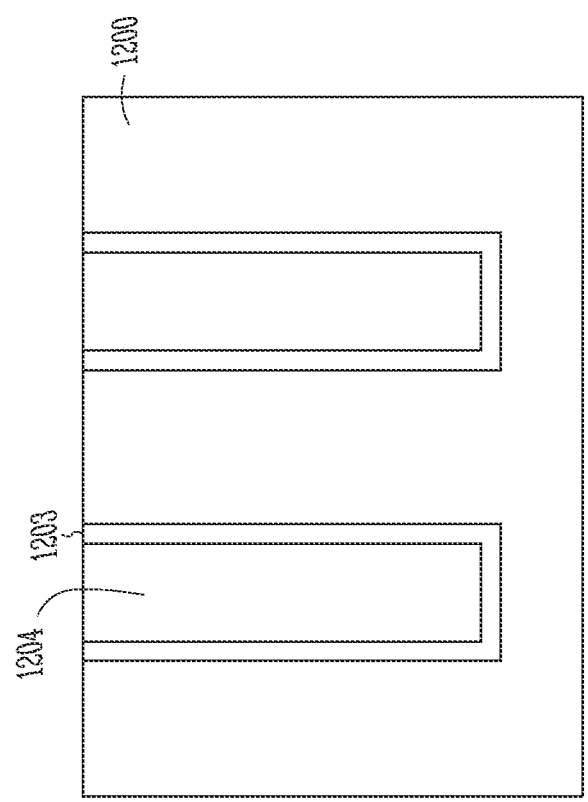
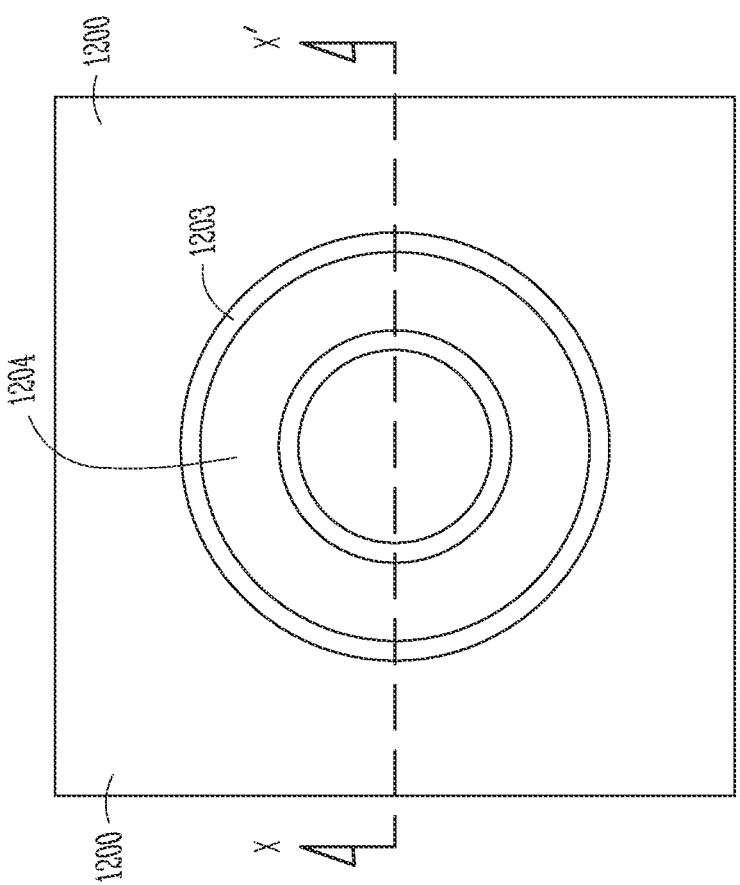

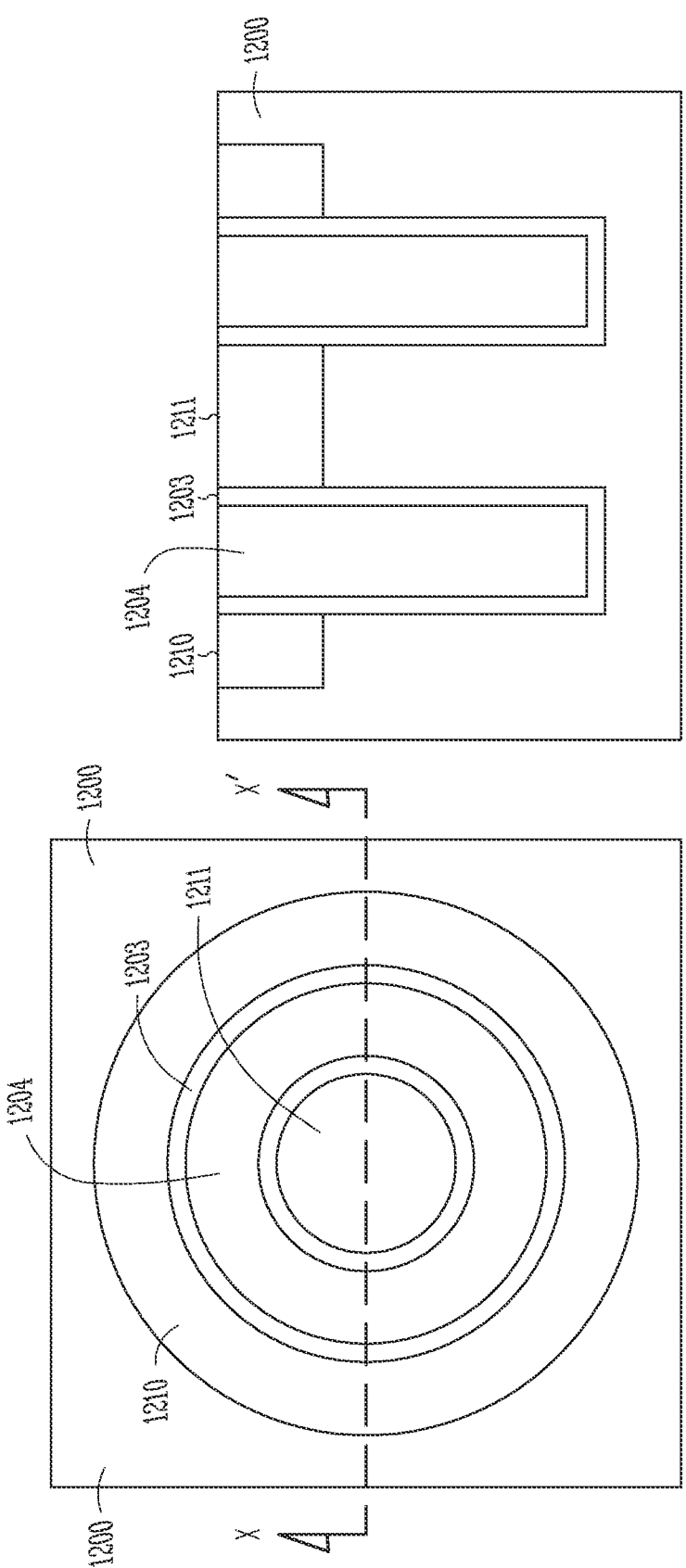

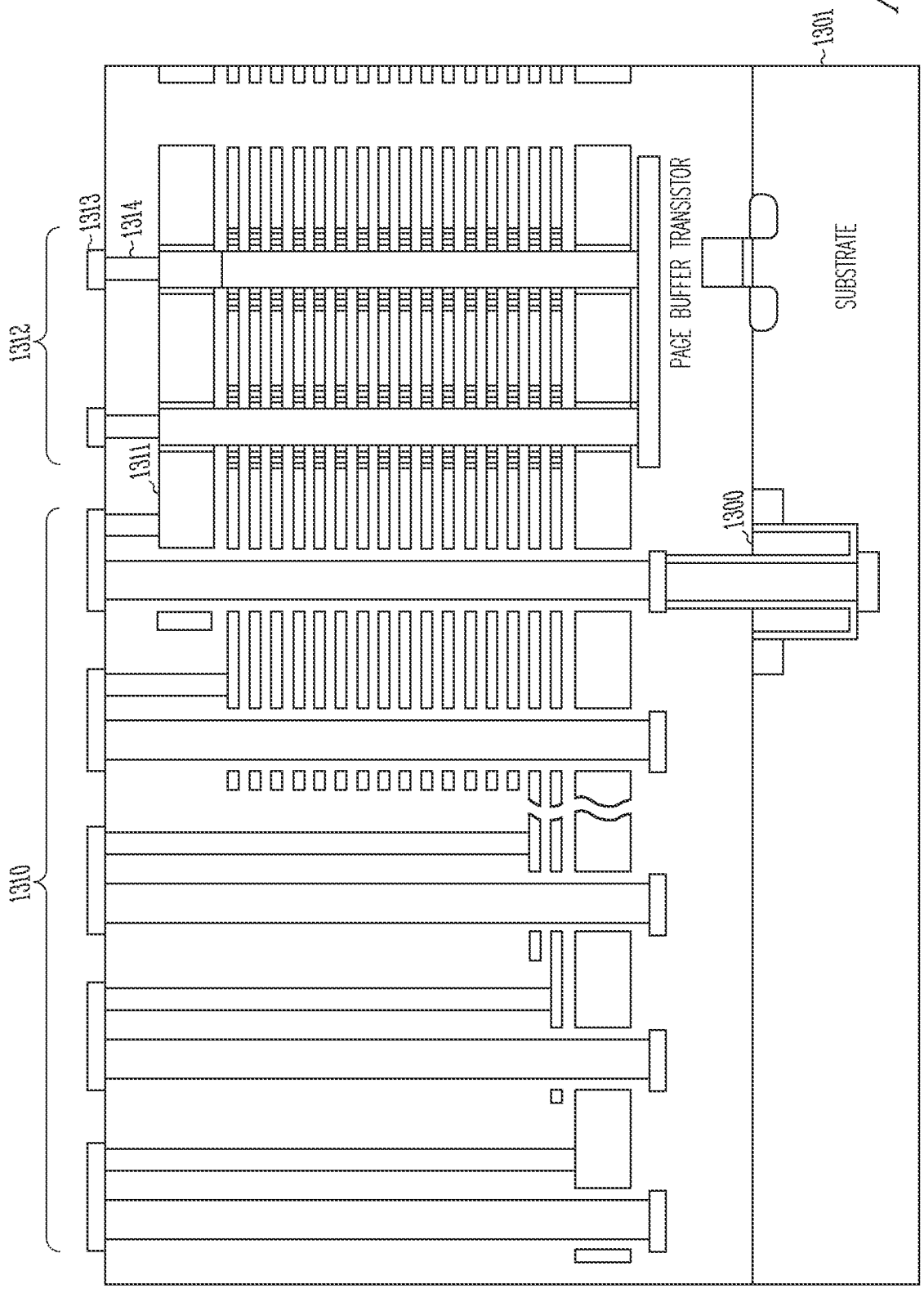

METHODS AND APPARATUSES WITH VERTICAL STRINGS OF MEMORY CELLS AND SUPPORT CIRCUITRY

PRIORITY APPLICATION

This application is a continuation of U.S. application Ser. No. 16/418,743, filed May 21, 2019, which is a continuation of U.S. application Ser. No. 15/011,819, filed Feb. 1, 2016, now issued as U.S. Pat. No. 10,319,729, which is a divisional of U.S. application Ser. No. 14/161,170, filed Jan. 22, 2014, now issued as U.S. Pat. No. 9,252,148, all of which are incorporated herein by reference in their entireties.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile (e.g., flash) memory.

In a continuing process of forming ever increasing number of memory cells on an integrated circuit wafer, memory manufacturers have relatively recently begun development of three-dimensional (3D) memory formed using semiconductor pillars. The process of forming vertical strings of memory cells along such pillars can create a thermal budget (e.g., total amount of thermal energy transferred to the wafer during an elevated temperature operation) that can damage other circuitry on the wafer. This problem can be exacerbated by the thermal budget used in forming multiple layers of these pillars on the same wafer.

There are general needs to make more compact memory devices without damaging memory support circuitry.

BRIEF DESCRIPTION OF THE DRAWINGS

FIG. 1 illustrates a schematic diagram of an embodiment of a string of memory cells.

FIG. 2 illustrates a cross-sectional view of an embodiment of a semiconductor construction of a string of memory cells in accordance with FIG. 1.

FIGS. 5A-5G illustrate a cross sectional view of a method for forming the apparatus in accordance with the embodiment of FIG. 3.

FIGS. 10A-10B illustrate top and cross-sectional views of an embodiment of a compact surround substrate transistor.

FIGS. 11A-11H illustrate an embodiment of a method for forming a compact surround substrate transistor in accordance with the embodiment of FIGS. 10A-10B.

FIGS. 12A-12F illustrate another embodiment of a method for forming a compact surround substrate transistor.

FIG. 13 illustrates a cross-sectional view of an embodiment of an apparatus including a plurality of semiconductor pillars and a compact surround substrate transistor.

DETAILED DESCRIPTION

Figure 3:
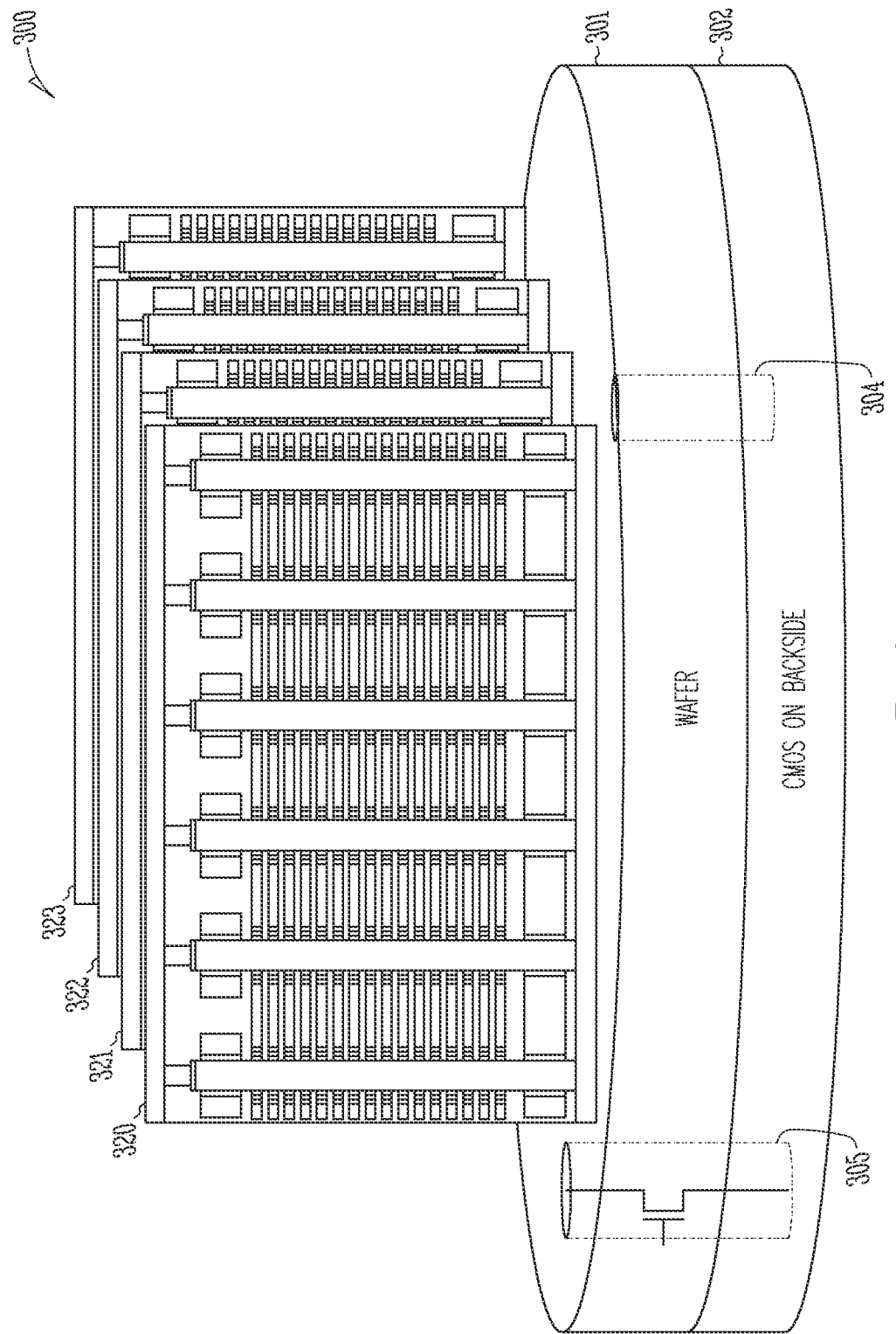
FIG. 3 illustrates a cross-sectional view of an embodiment of an apparatus having a plurality of strings of memory cells on a topside of a substrate and CMOS circuitry on a backside of the substrate.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The following disclosure refers to NAND non-volatile memory for the purposes of illustration only. The present disclosure is not limited to any one type of memory. For example, the memory might include non-volatile memory (e.g., NAND Flash, NOR Flash, phase change memory (PCM), etc.) or volatile memory (e.g., DRAM, SRAM, etc.).

FIG. 1 illustrates a schematic diagram of an embodiment of a string of vertically stacked memory cells 100 formed above a substrate (shown in FIG. 3). For purposes of illustration only, the string of memory cells 100 is shown having 16 memory cells 112 that can be formed in 16 memory cell tiers (e.g., layers) above the substrate. Alternate embodiments can include more or less than 16 memory cells 112 and/or more or less memory cell tiers.

The string of memory cells 100 can include a source select device 120 that may be an n-channel transistor coupled between one of the memory cells 112 at one end of the string of memory cells 100 and a common source 126. The common source 126 may comprise, for example, a slot of commonly doped semiconductor material and/or other electrically conductive material. The common source 126 can be coupled to a reference voltage $V_{SS}$ (e.g., ground) or a voltage source (e.g., a charge pump circuit not shown).

At the other end of the string of memory cells 100, a drain select device 130 may be an n-channel transistor coupled between one of the memory cells 112 and a data line (e.g., bit line) 134. The data line 134 can eventually be coupled to sense circuitry (not shown) for sensing (e.g., reading) a state of a selected memory cell 112.

Each memory cell 112 may comprise, for example, a floating gate transistor or a charge trap transistor. Each memory cell 112 can be a single level cell (SLC) for storing two bits of data or a multiple level cell (MLC) for storing two or more bits of data.

The memory cells 112, the source select gate transistor 120, and the drain select gate transistor 130 can be controlled by signals on their respective control gates. The signals on the control gates of the memory cells 112 can be provided on access lines (e.g., word lines) WL0-WL15. In an embodiment, the control gates of memory cells in a row of memory cells can at least partially form an access line.

The source select gate transistor 120 can receive a control signal that controls the source select gate transistor 120 to substantially control conduction between the string of memory cells 100 and the common source 126. The drain select gate transistor 130 can receive a control signal that controls the drain select gate transistor 130 so that the drain select gate transistor 130 can be used to select or deselect the string 100. The string 100 can be one of multiple strings of memory cells in a block of memory cells in a memory device, such as a NAND memory device.

FIG. 2 illustrates a cross-sectional view of an embodiment of semiconductor construction of the string of memory cells 100 of FIG. 1. The memory cells 112, source select gate transistor 120 and the drain select gate transistor 130 at least partially surround (e.g., surround or partially surround) a semiconductor material 210. The semiconductor material 210, in one embodiment, can comprise a pillar of p-type polysilicon and can be used as a channel for the memory cells 112, the source select gate transistor 120 and the drain select gate transistor 130. The memory cells 112, the source select gate transistor 120 and the drain select gate transistor 130 can thus be associated with the pillar of semiconductor material 210. The pillar of semiconductor material 210 can extend between a source cap 220 (e.g., n+ type polysilicon) and a drain cap 230 (e.g., n+ type polysilicon). The source cap 220 can be in electrical contact with the pillar of semiconductor material 210 and can form a p-n junction with the semiconductor material 210. The drain cap 230 can be in electrical contact with the pillar of semiconductor material 210 and can form a p-n junction with the semiconductor material 210. The source cap 220 can be a source for the pillar of semiconductor material 210 and the drain cap 230 can be a drain for the pillar of semiconductor material 210. The source cap 220 can be coupled to the common source 126. The drain cap 230 can be coupled to the data line 134.

FIG. 3 illustrates a cross-sectional view of an embodiment of an apparatus having a plurality of strings of memory cells 300 formed along pillars on a topside of a substrate 301 and extending outward from the substrate 301. For example, a plurality of strings of memory cells 300, as illustrated in FIG. 3, can be formed on and extend outward from the substrate 301. At least one string of memory cells can be formed along each pillar.

The plurality of strings of memory cells 300 can comprise a plurality of groups (e.g., blocks) of strings of memory cells 320-323 formed horizontally across the topside of the substrate 301 as shown. In another embodiment, the plurality of groups of strings of memory cells 320-323 can be formed extending vertically in tiers (not shown) from the topside of the substrate 301.

The substrate 301 can be a silicon substrate. Another embodiment can use other substrate materials, such as germanium, or combinations of substrate materials. The substrate 301 can also include a silicon-on-insulator (SOI) construction.

The substrate 301 can include circuitry 302 (e.g., complementary metal-oxide semiconductor (CMOS) circuitry) on the backside of the substrate 301. This circuitry 302 can include support circuitry for the plurality of strings of memory cells 300 formed on the topside of the substrate 301. In an embodiment, the support circuitry 302 can be CMOS circuitry 302. Other embodiments might use other integrated circuit fabrication technologies in constructing the support circuitry 302 that are different from the fabrication technology used to construct the plurality of strings of memory cells 300. Support circuitry 302 can be defined as any circuitry that may be used by or coupled to the plurality of strings of memory cells.

The support circuitry 302 on the backside of the substrate 301 can be coupled to the plurality of strings of memory cells 300 through vertical interconnects 304 (e.g., Through Silicon Vias (TSVs)). As described subsequently, these vertical interconnects 304 can include transistors 305 (e.g., high-voltage transistors) that can couple the support circuitry 302 to the plurality of strings of memory cells 300. In an embodiment, as described subsequently, the transistors 305 can also be referred to as surround substrate transistors 305 (SST).

As known by those skilled in the art, a surround gate transistor (SGT) can comprise a central semiconductor region that acts as the channel region with the source/drain regions on each end of the channel region. A control gate can surround the central semiconductor region. An SST is different in that it includes the control gate in the center of the transistor with the substrate surrounding the control gate. Thus, the channel region in an SST can surround the control gate.

In order to reduce the thermal budget to which the support circuitry 302 would be exposed, the plurality of strings of memory cells 300 can be formed (e.g., fabricated) prior to forming the support circuitry 302. Thus, the support circuitry 302 may not be exposed to the total thermal budget generated from the fabrication of multiple groups (e.g., tiers) of strings of memory cells. Such a fabrication flow is illustrated in FIGS. 5A-5G and described subsequently.

Figure 4:
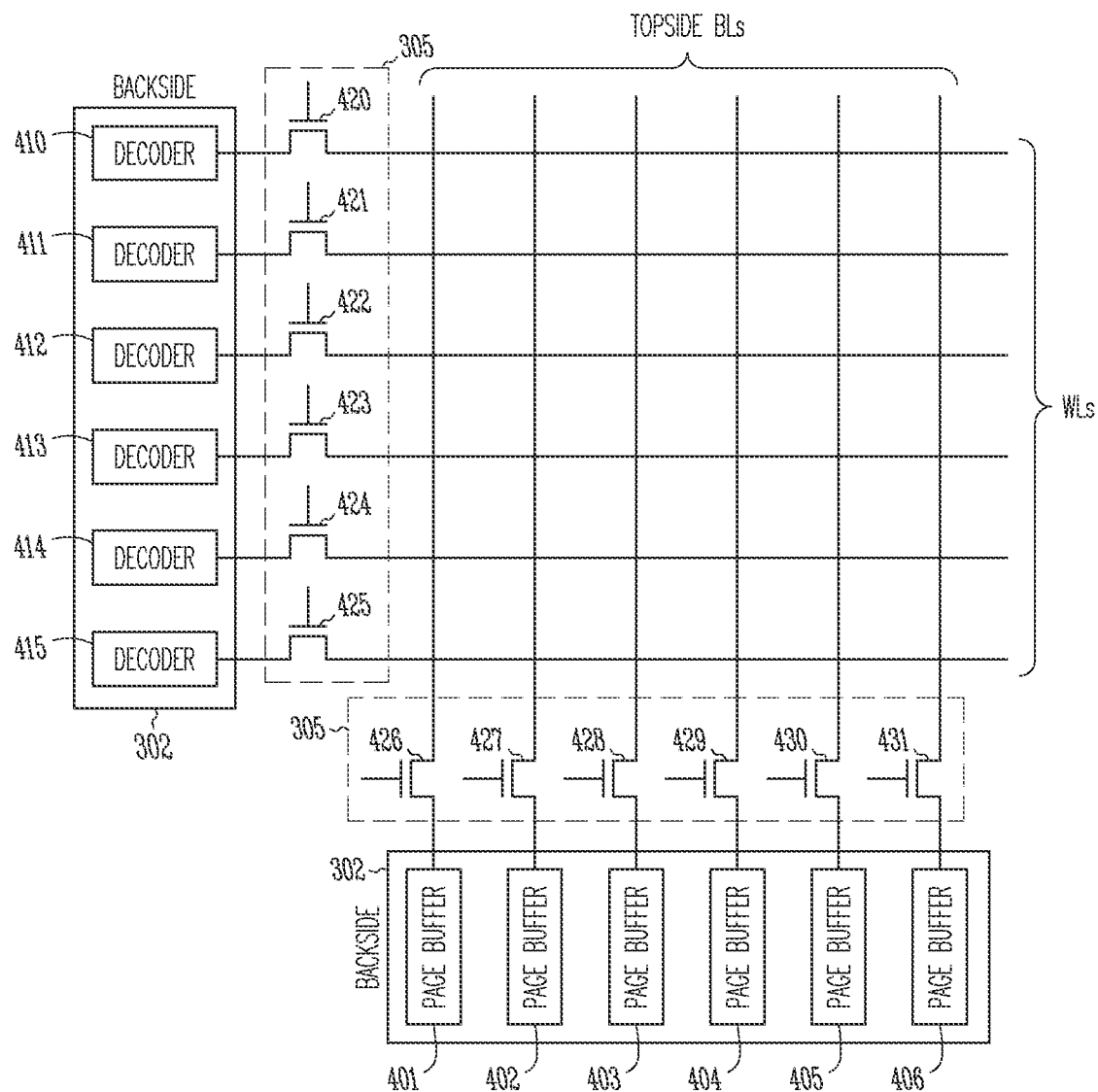
FIG. 4 illustrates a schematic diagram of an embodiment of memory circuitry in accordance with the embodiment of FIG. 3.

FIG. 4 illustrates a schematic diagram of an embodiment of memory circuitry in accordance with the embodiment of FIG. 3. For purposes of clarity, this figure shows only the circuitry associated with a single group of strings of memory cells 320, support circuitry 302, and surround substrate transistors 305. One skilled in the art would realize that this circuitry can be duplicated for additional groups of strings of memory cells.

A group of strings of memory cells 320 of FIG. 3 is represented in FIG. 4 by a schematic of a memory cell array 320 that can be formed on the topside of the substrate 301 of FIG. 3. This memory cell array 320 can use support circuitry 302 formed on the backside of the substrate 301. The support circuitry 302 can include, for example, page buffers 401-406 and decoders 410-415.

The memory cell array 320 can be coupled to the support circuitry 302 through individual surround substrate transistors 420-431 formed between the topside of the substrate 301 and the backside of the substrate 301. The surround substrate transistors 420-431 can be referred to as high voltage transistors due to their function of coupling relatively high voltages (e.g., 15V-20V) for memory operations (e.g., programming, erasing) to the memory array 320.

FIGS. 5A-5G illustrate an embodiment of a process flow for fabrication of an apparatus having a plurality of strings of memory cells on the topside of the substrate 301 and support circuitry 302 on the backside of the substrate, as illustrated in FIG. 3. The process flow of FIGS. 5A-5G is for purposes of illustration only as other process flows can be used to accomplish the same or substantially similar results.

Figure 5A:
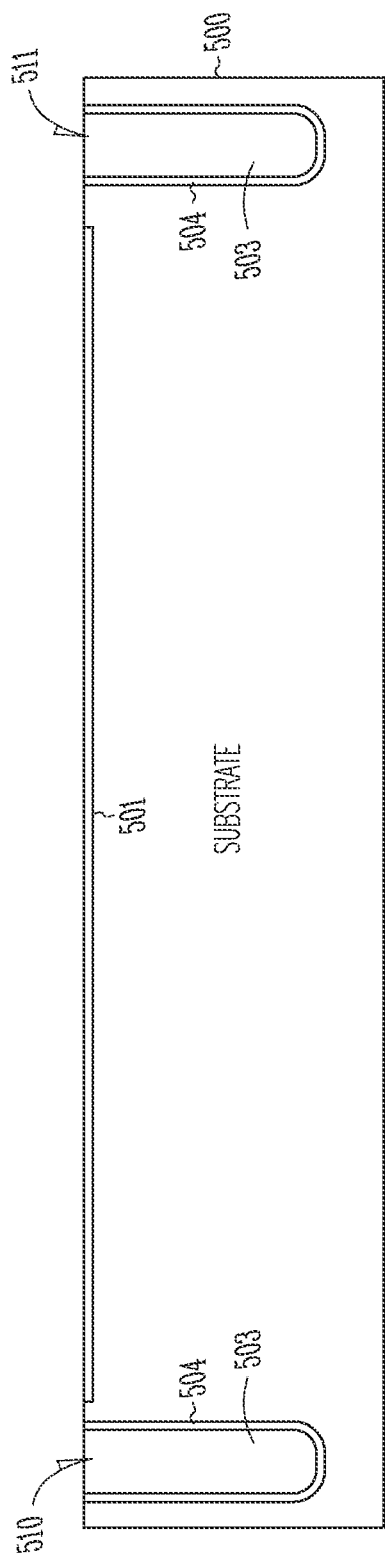

Referring to FIG. 5A, a substrate 500 can include a p-type substrate of silicon. Other embodiments might use other materials and other conductivity types. Openings (e.g., holes) 510, 511 can be formed (e.g., directionally etched) in the substrate 500 and lined with an electrically insulative material 504 (e.g., oxide, $SiO_2$) and then filled with an electrically conductive material 503 (e.g., metal, polysilicon). The openings 510, 511 can be formed such that they do not go all the way through the substrate 500. A diffusion region 501 (e.g., n+ diffusion) can be formed on top of the substrate 500. The diffusion region 501 can be implanted having an opposite conductivity from the substrate conductivity.

Figure 5B:
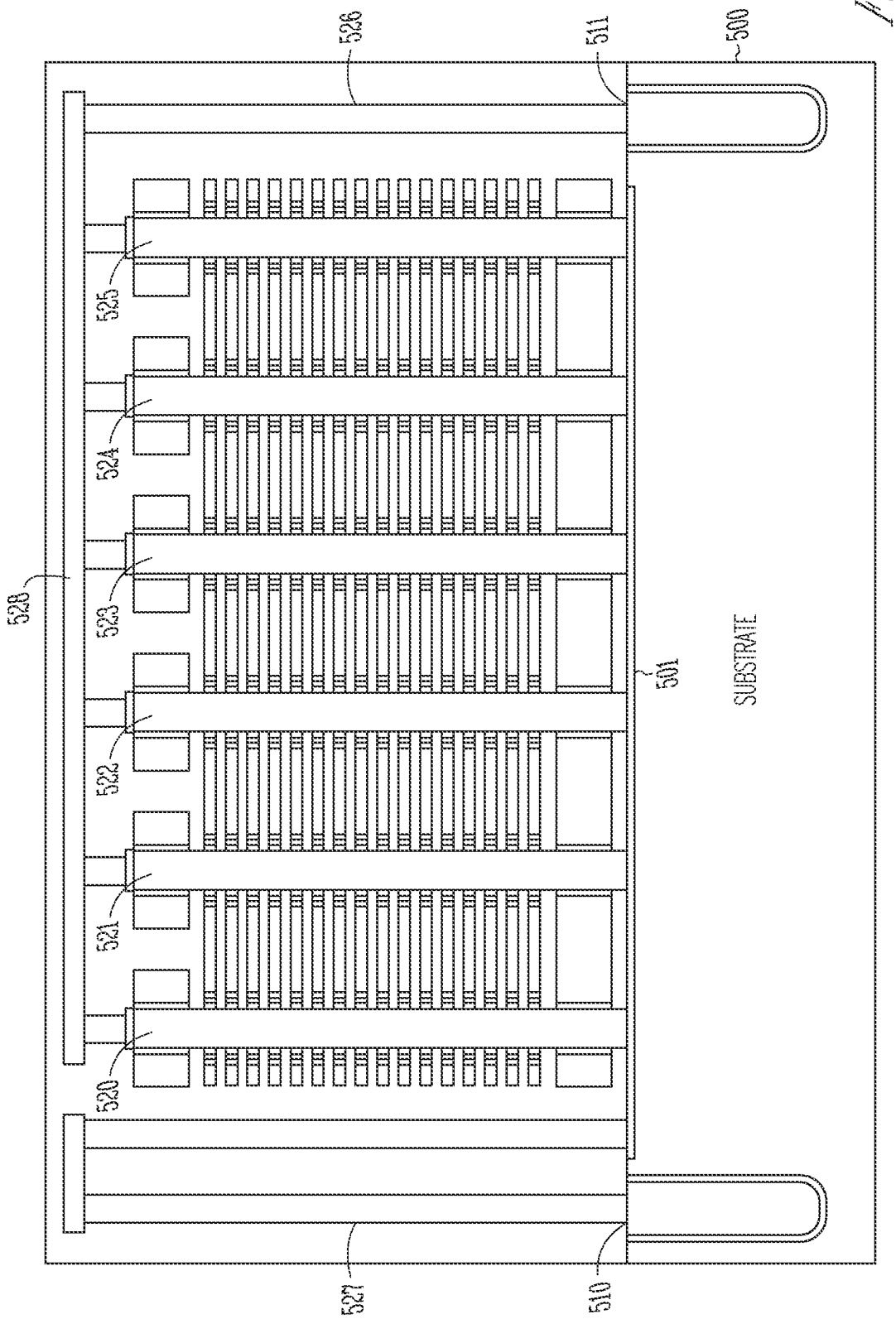

FIG. 5B shows a plurality of strings of memory cells formed on the top of the substrate 500. The semiconductor pillars 520-525 of such strings can be coupled to the n+ diffusion 501 on the top of the substrate 500. In an embodiment, the n+ diffusion 501 can operate as a source for the plurality of strings of memory cells.

The electrically conductive material in one opening 510 can be coupled to the n+ diffusion 501 through a conductor 527. The electrically conductive material in the other opening 511 can be coupled to a data line 528 through a conductor 526. The data line 528 can then be coupled to each of the semiconductor pillars 520-525.

Figure 5C:
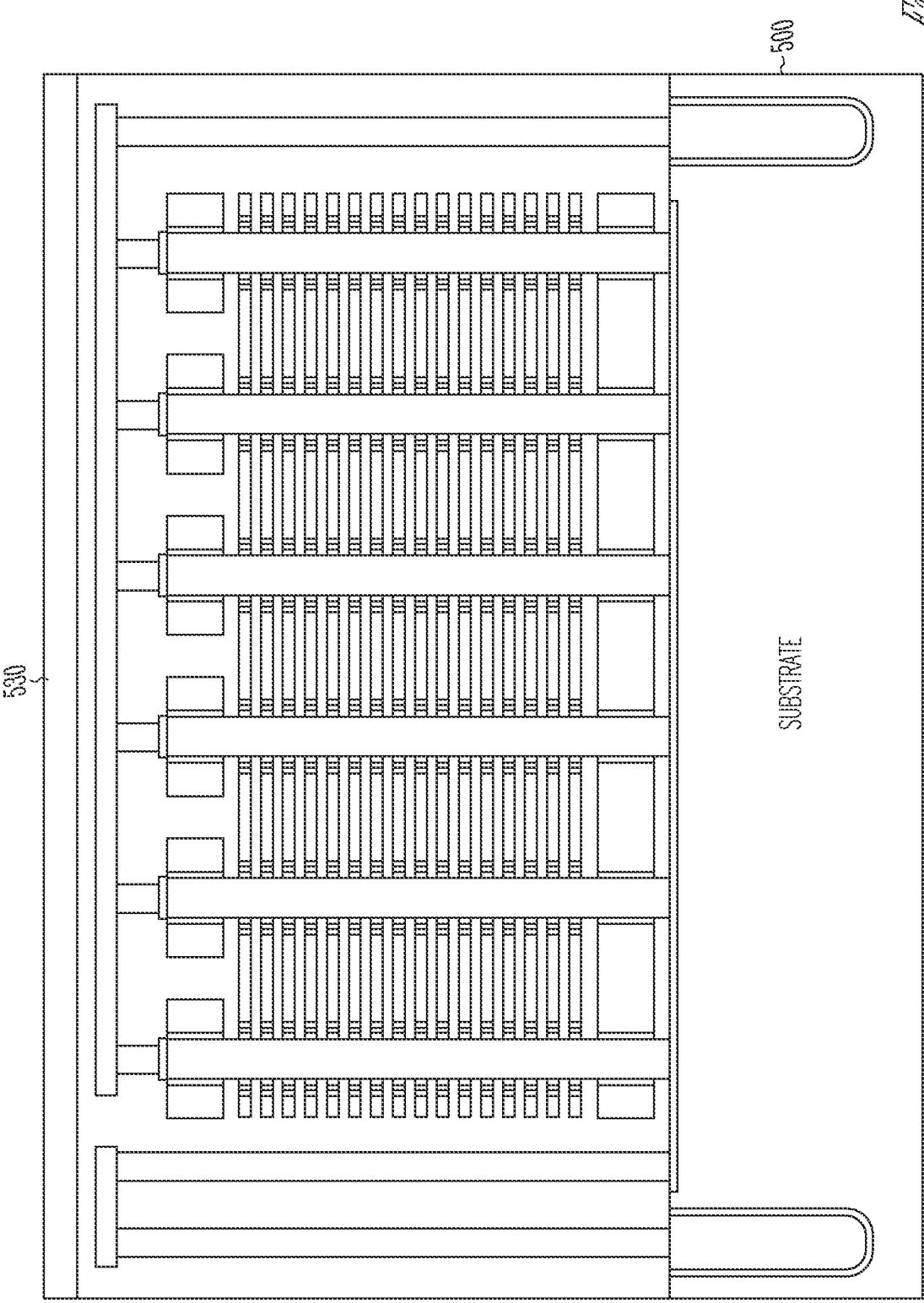

FIG. 5C shows a mechanical support substrate 530 formed over the plurality of pillars 520-525 and coupled to the substrate 500. The mechanical support substrate 530 can help protect and support the plurality of pillars 520-525 as well as other circuitry, especially during the substrate thinning process illustrated in FIG. 5D. The mechanical support substrate 530 may be temporary and removed later or kept as permanent support as part of the apparatus.

Figure 5D:
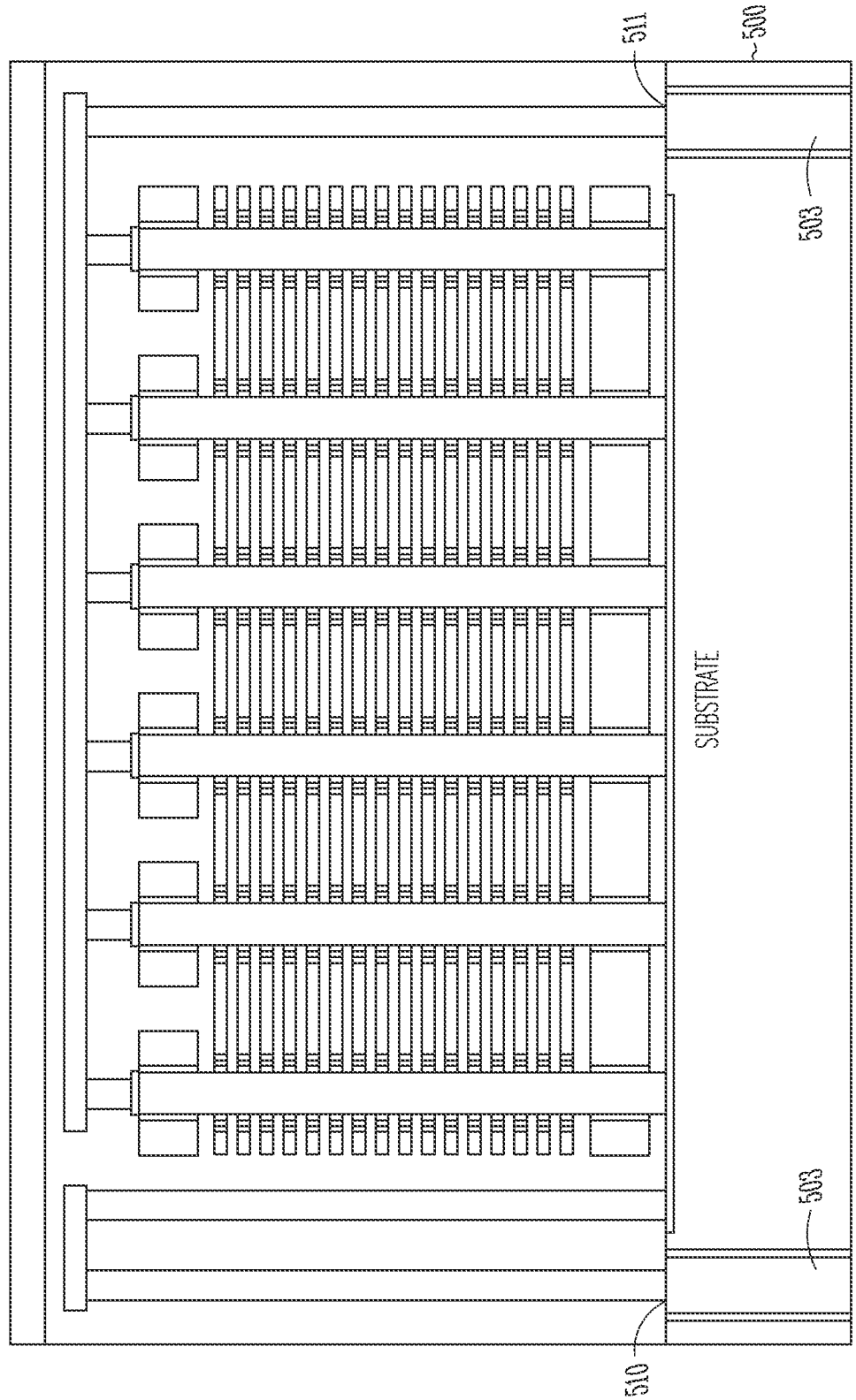

FIG. 5D shows that the substrate 500 can then be thinned. A grinding process on the backside of the substrate can be used to reduce the thickness. For example, the grinding process can be used to make a 2-10 μm thick substrate.

During the grinding process, the electrically conductive material 503 in the openings 510, 511 is now exposed on the backside in order to be accessible in subsequent fabrication steps. The electrically conductive material 503 in the openings 510, 511 can now act as vertical interconnects (e.g., TSV) between the topside strings of memory cells 300 and the backside support circuitry 302 (the electrically conductive material 503 in the openings 510, 511 is sometimes referred to hereafter as vertical interconnects 510, 511).

Figure 5E:
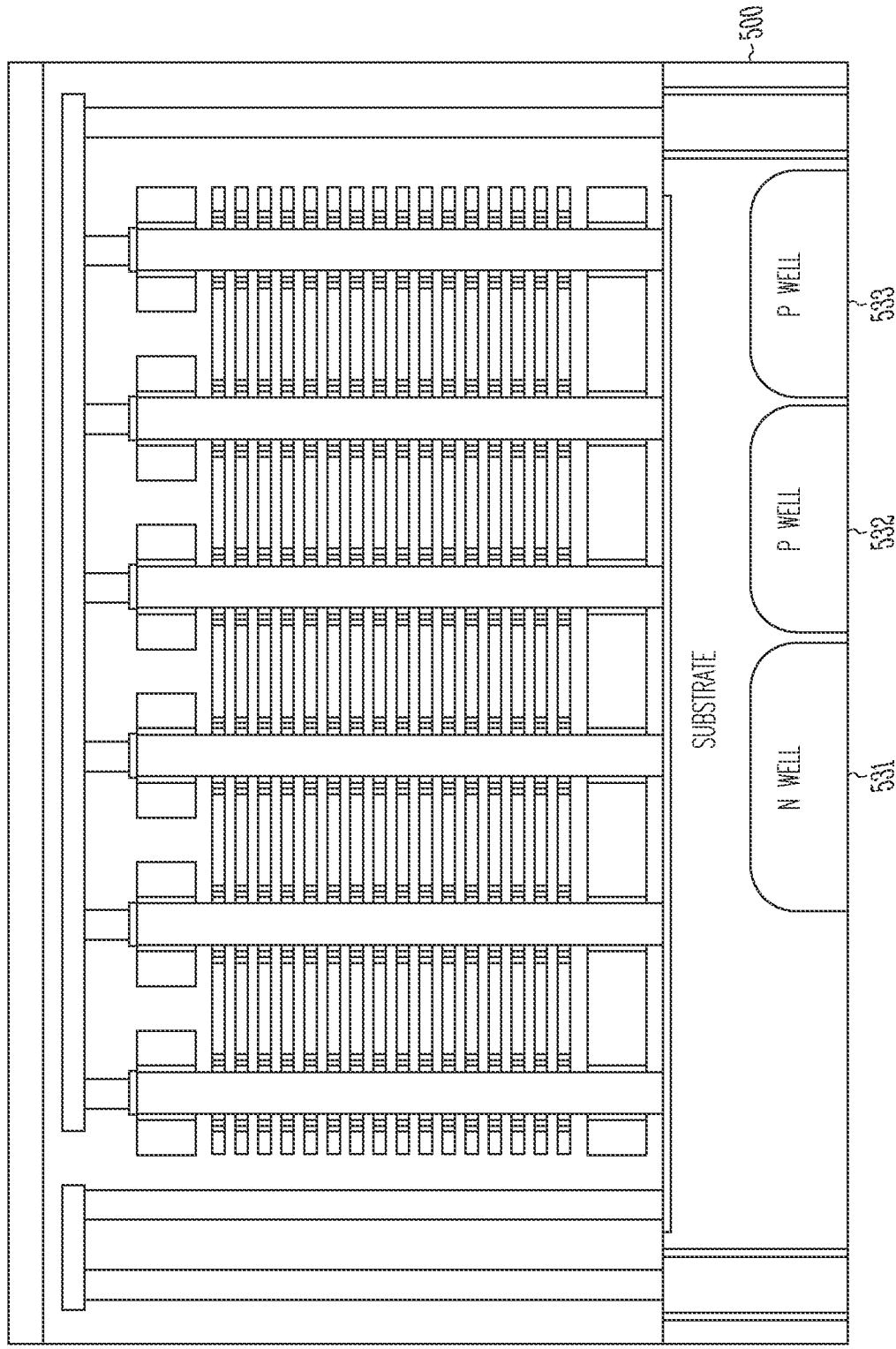

FIG. 5E shows different conductivity wells 531-533 being formed (e.g., doped) into the substrate 500. In the illustrated embodiment, one n-well 531 and two p-wells 532-533 are formed in the substrate. Other embodiments might form other quantities of wells having different conductivities.

FIG. 5F shows the various support circuitry (e.g., CMOS support circuitry) 302 as illustrated previously in FIG. 3. The diffusion regions for the support circuitry can be implanted in an associated well 531-533. The remaining elements of the support circuitry can be formed in the substrate as well or on the backside surface. For example, a first metal layer 540 and a second metal layer 541 can be formed during a CMOS fabrication method in order to form, for example, various CMOS decoders, buffers, and transistors of the support circuitry 302. Other embodiments may not use metal layers or the CMOS fabrication method.

Figure 5G:
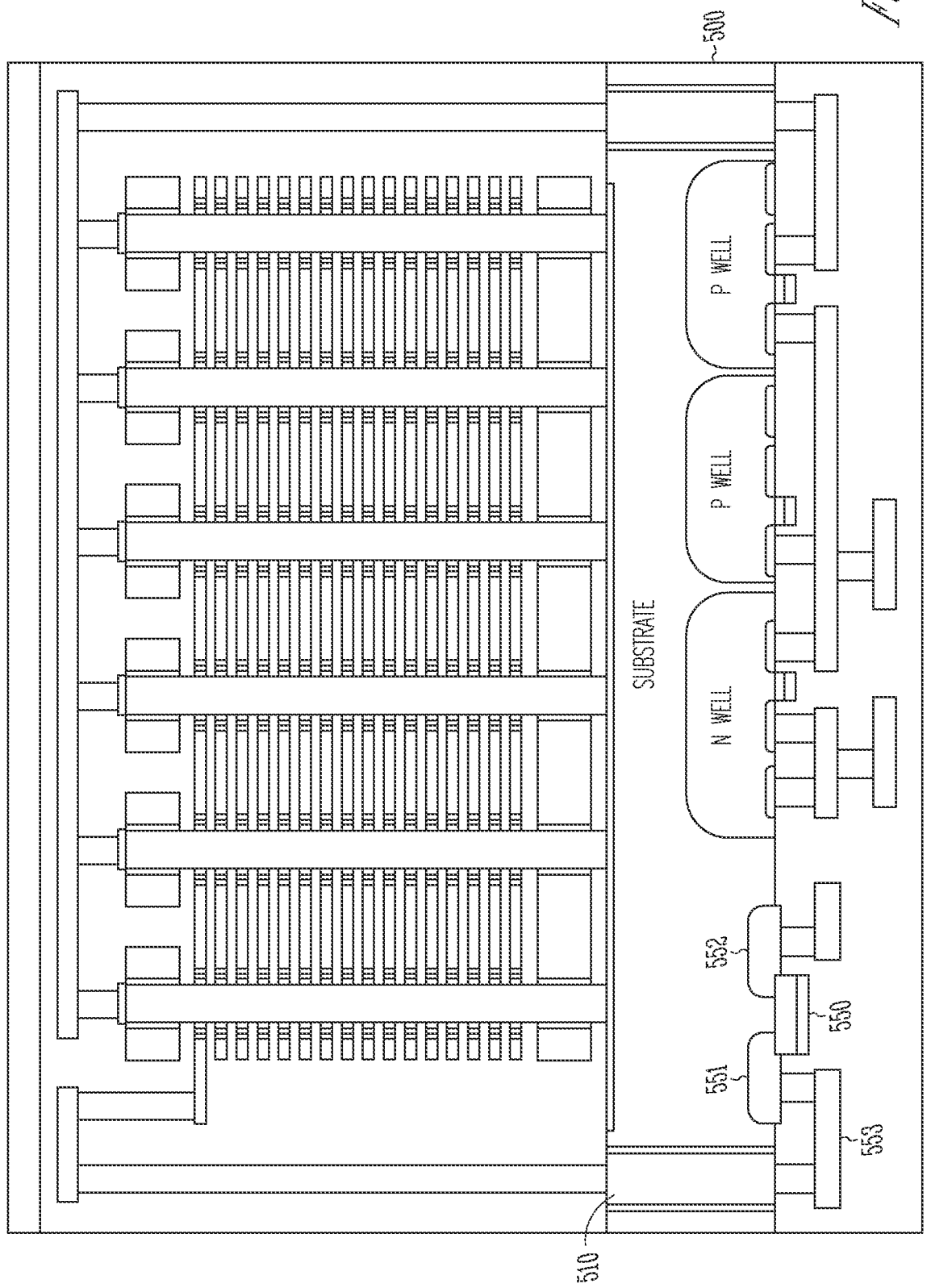

FIG. 5G shows an embodiment where a transistor (e.g., HV transistor) 550 can be formed on the backside of the substrate 500. This transistor 550 can be used as a control gate driver for the control gates of the memory cells of the plurality of strings of memory cells. The transistor 550 can be formed with a pair of source/drain regions 551, 552. One of the source/drain regions 551 can be coupled to one of the vertical interconnects 510 with a conductor 553. After the support circuitry on the backside of the substrate 500 has been formed, the mechanical support substrate can be removed.

Figure 6:
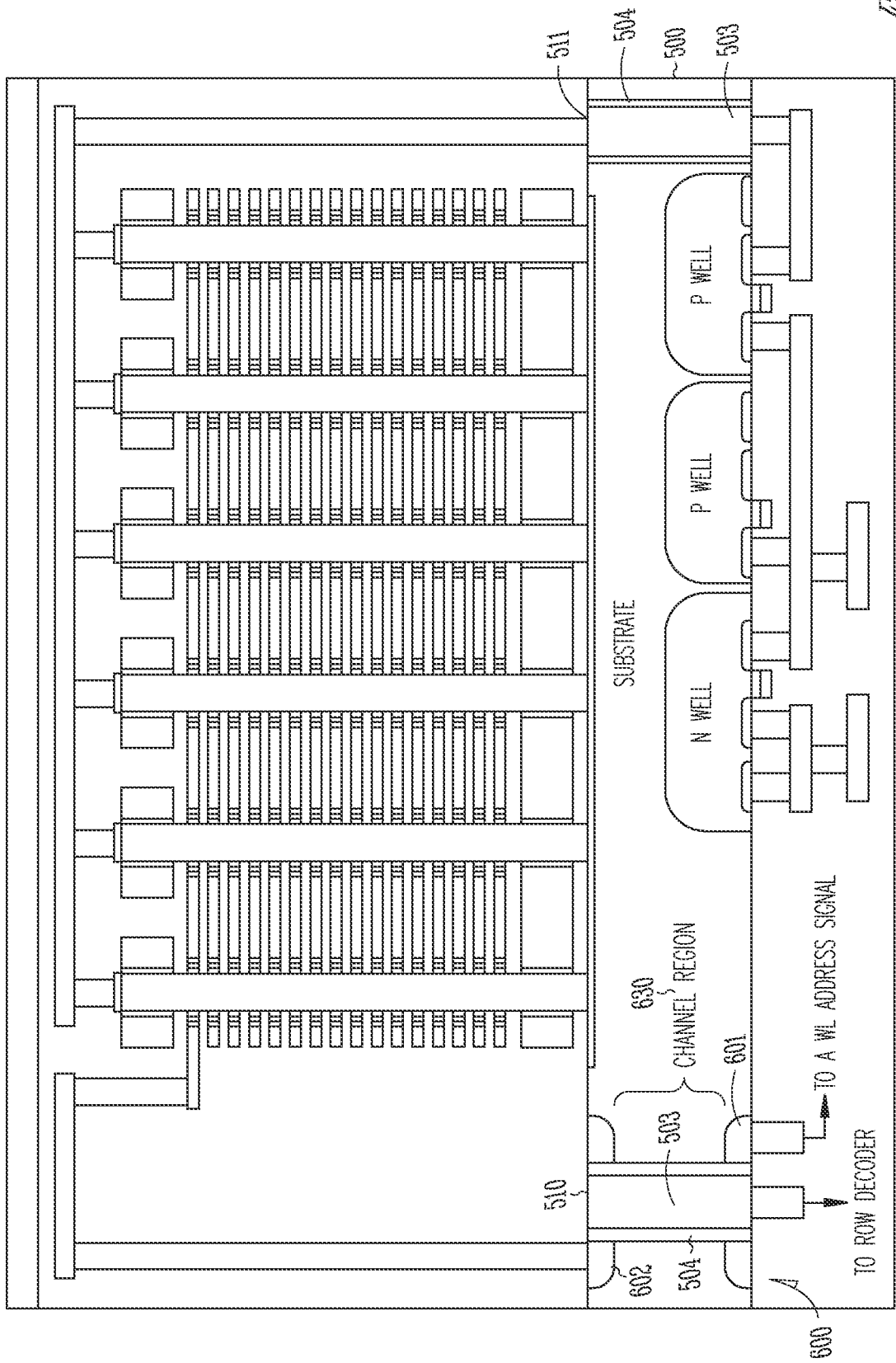
FIG. 6 illustrates a cross-sectional view of another embodiment of the apparatus having surround substrate transistors.

FIG. 6 illustrates a cross-sectional view of an embodiment of an apparatus where a vertical interconnect 510 is a SST 600 that acts as a control gate driver for control gates of the memory cells of the plurality of strings of memory cells. In such an embodiment, the SST 600 can have a substantially similar structure as other vertical interconnects 511, such as the electrically insulative material 504 and the electrically conductive material 503. However, the SST 600 can additionally have source/drain regions 601, 602 that can create a channel 630 beneath the electrically insulative material 504 in the substrate 500 when properly biased. The electrically conductive material 503 can act as the control gate of the SST 600.

In the embodiment of FIG. 6, one source/drain region 602 on the topside of the substrate 500 can be coupled to a row of control gates for memory cells of the plurality of strings of memory cells. The other source/drain region 601 on the backside of the substrate 500 can be coupled to one of the WL address signals. The electrically conductive material 503 (e.g., SST control gate) can be coupled to other memory support circuitry not shown (e.g., row decoder).

Figure 7:
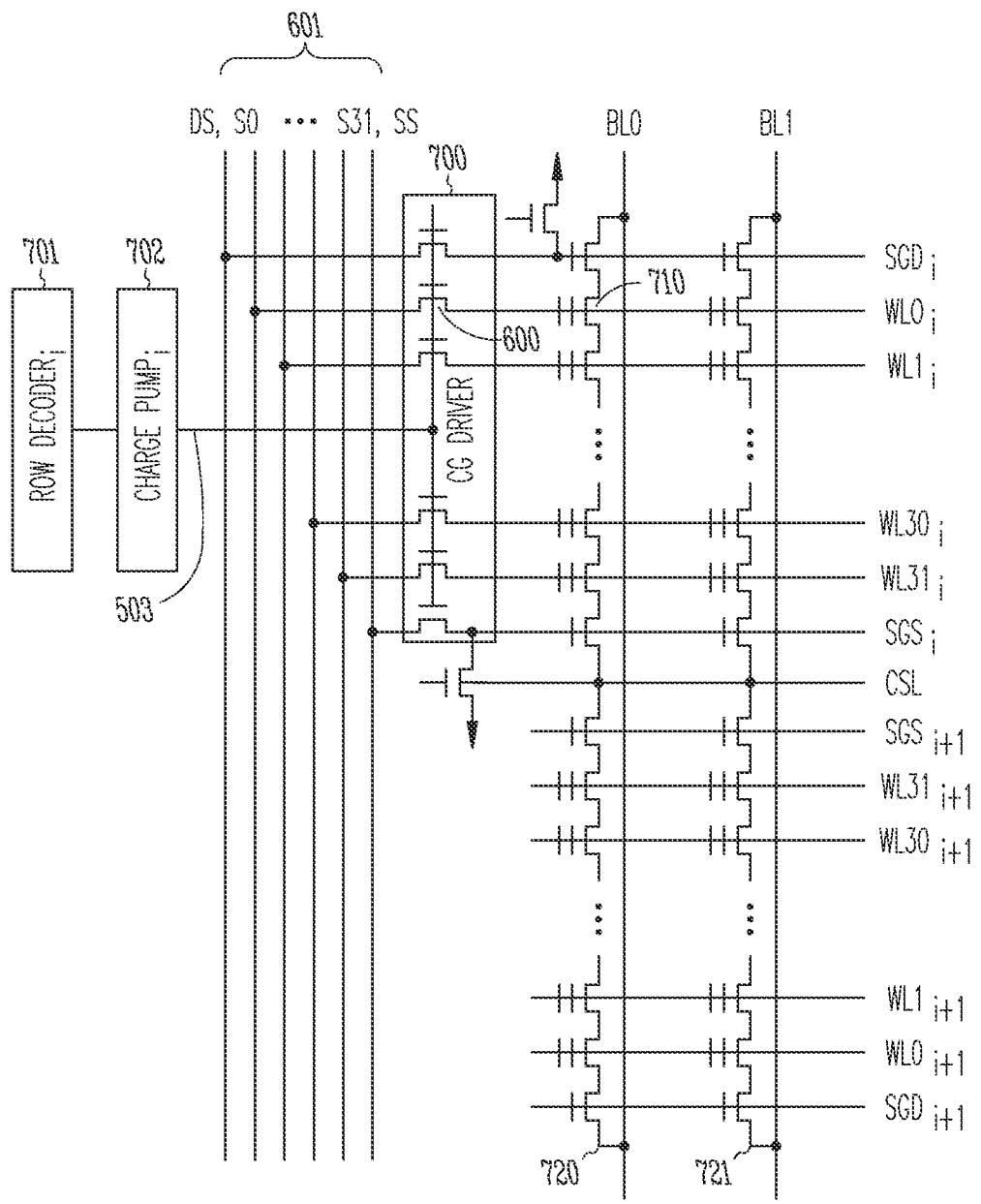
FIG. 7 illustrates a schematic diagram of the apparatus in accordance with the embodiment of FIG. 6.

One such implementation of the apparatus of FIG. 6 is illustrated in FIG. 7. FIG. 7 illustrates a schematic diagram of an embodiment of the apparatus of FIG. 6 that can incorporate a SST 600 as a vertical interconnect.

The schematic shows a plurality of strings of memory cells 720, 721 each coupled to a respective data line BL0, BL1. A control gate of a particular memory cell 710 can be coupled to one source/drain connection (e.g., source drain region) of the SST 600 of FIG. 6 acting as a control gate driver of a plurality of control gate drivers 700. The other source/drain connection (e.g., source/drain region) of the SST 600 control gate driver can be coupled to a WL address signal S0.

A row decoder 701 for selecting a particular control gate driver of the plurality of control gate drivers 700 can be coupled to the control gates of the plurality of control gate drivers 700. A charge pump 702 can also be coupled to the control gates of the plurality of control gate drivers 700 for generating voltages to bias the control gate drivers.

Figure 8:
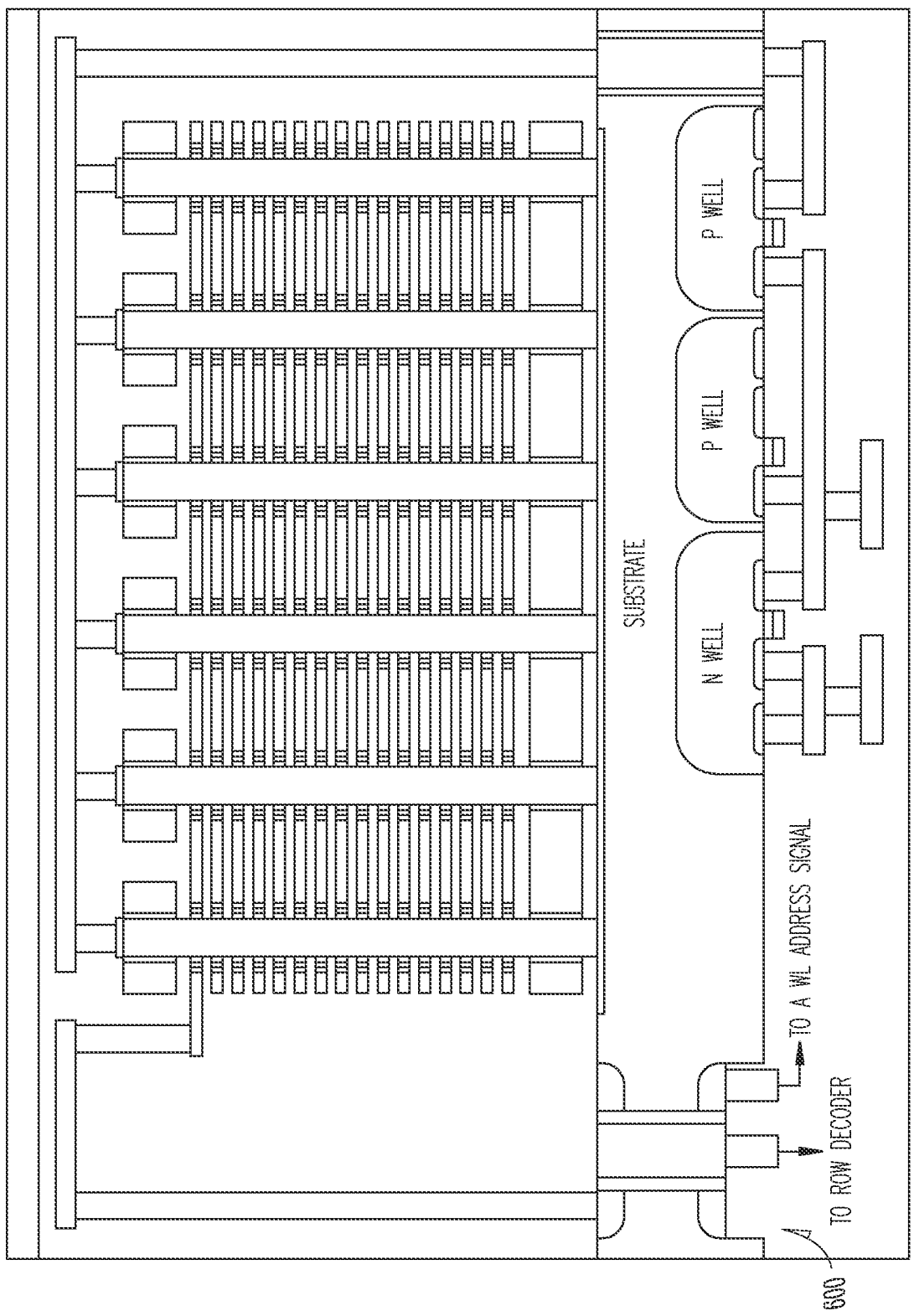
FIG. 8 illustrates a cross-sectional view of another embodiment of the apparatus having surround substrate transistors.

FIG. 8 illustrates an embodiment similar to the SST 600 embodiment of FIG. 6 but the channel length of the SST 600 can be altered by direction etching of the substrate. The etching can create a depression in which the SST 600 is formed in order to shorten the channel length and change the electrical characteristics of the SST 600.

Figure 9A:
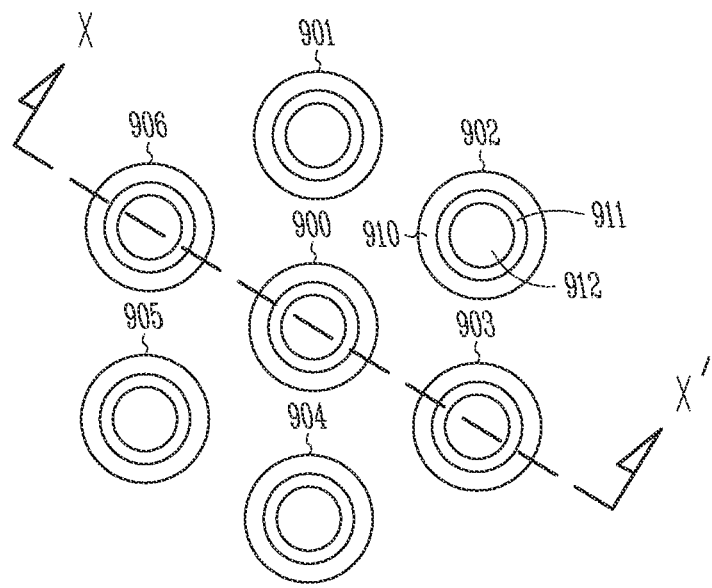
FIGS. 9A-9C illustrate top and cross-sectional operational views of a plurality of surround substrate transistors.
Figure 9B:
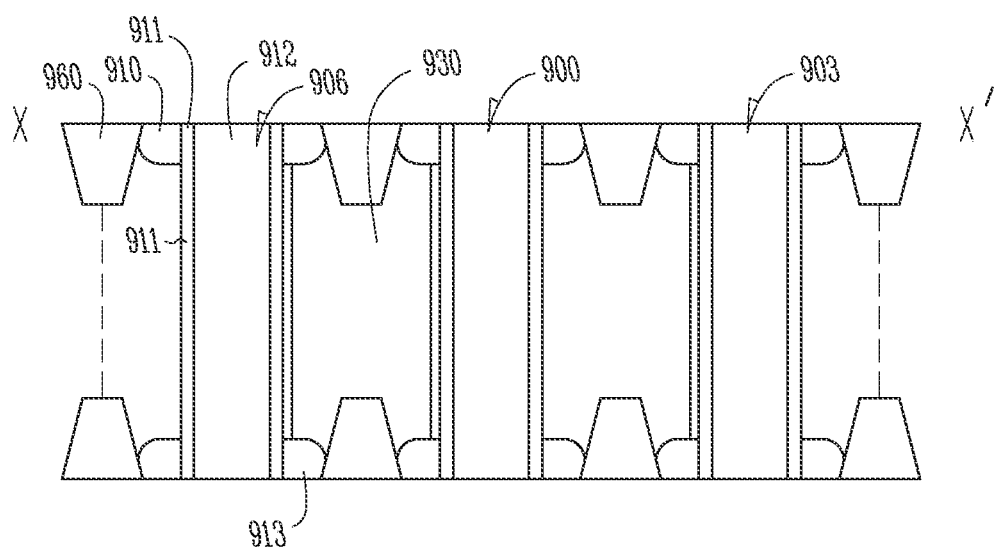
Figure 9C:
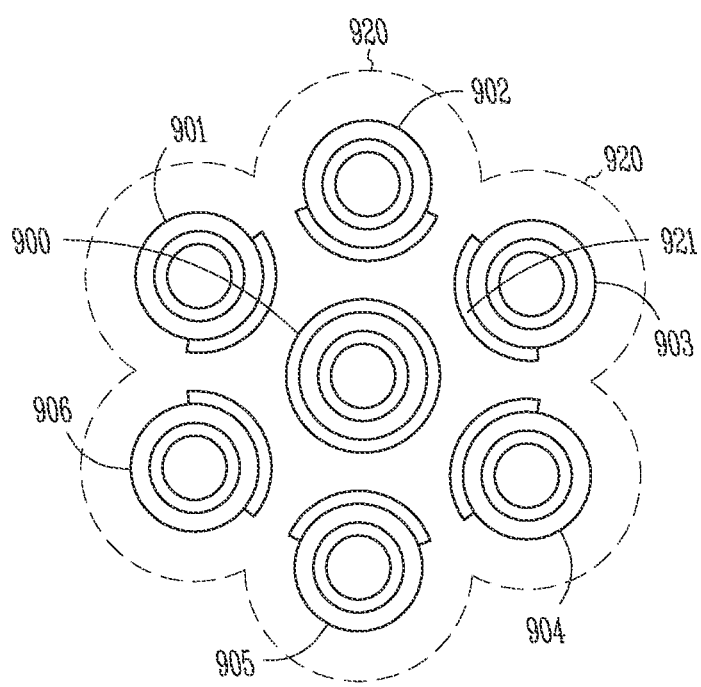

FIGS. 9A-9C illustrate top and cross-sectional operational views of an embodiment having a plurality of SSTs that are in relatively close proximity to each other such that their respective electrical fields generated during transistor operation can affect the electrical characteristics of the adjacent SSTs. The apparatus of FIG. 3 can incorporate a plurality of the SSTs in relatively close proximity, as shown in the schematic of FIG. 7 and discussed previously.

FIG. 9A illustrates a top view of seven SST's 900-906 that can be formed in a substrate. Each SST 900-906 can comprise a circular source/drain region 910 on a topside of the substrate and a circular source/drain region 913 on a backside of the substrate (see FIG. 9B). An electrically insulative material 911 (e.g., oxide, $SiO_2$) can line the sides of each opening and separate the electrically conductive material (e.g., control gate) 912 from the substrate and source/drain regions 910, 913.

FIG. 9B illustrates a cross-sectional view along axis X-X' that runs through SSTs 900, 903, 906 of FIG. 9A. This figure shows the fully depleted, low threshold channel region for the center SST 900 that can be created by the adjacent SSTs 901-906 as illustrated in the operational view of FIG. 9C.

The SSTs 900, 903, 906 can be separated by shallow trench isolation (STI) 960. Other embodiments may use only top STI 960, only bottom STI 960, or no STI 960 on either the top or the bottom.

FIG. 9C illustrates a top operational view of the SSTs 900-906 of FIG. 9A. When properly biased, the outer SSTs 901-906 (e.g., assist gates) each generate a respective depletion region 920 in a circular pattern around a center SST 900. Approximately 120° of arc 921 of the depletion region 920 facing the center SST 900 has an effect on the channel region of the center SST 900. Thus, with six of the SST's 901-906 surrounding the center SST 900, the depletion region arc 921 from each outer SST 901-906 can have a 360° depletion effect on the channel region of the center SST 900. This can result in a reduced threshold voltage $V_{th}$ for the channel region of the center SST 900.

FIGS. 10A and 10B illustrate another embodiment of a transistor that can be incorporated into the apparatus of FIG. 3. This embodiment is a compact surround substrate transistor (C-SST). Such a transistor can be incorporated into the substrate so that less real estate may be used as compared to a transistor formed on the substrate.

FIG. 10A illustrates a drain 1001 formed in a substantially annular pattern (e.g., at least partially encircling) in the substrate 1000. An electrically insulative material (e.g., gate insulator, oxide. $SiO_2$) is formed in a substantially annular pattern between the drain 1001 and a substantially annular patterned control gate 1003 (e.g., metal, polysilicon). Another electrically insulative material 1005 (e.g., oxide, $SiO_2$) is formed in a substantially annular pattern between the control gate 1003 and a metal plug 1004 that can be formed as a circular pattern substantially in the center of the transistor. As shown in the cross-sectional view of FIG. 10B, the first electrically insulative material 1002 and the second electrically insulative material 1005 can be one continuous electrically insulative material.

FIG. 10B illustrates a cross-sectional view of the C-SST of FIG. 10A along the X-X' axis. This figure shows the addition of the source 1010 formed in the substrate 1000 and coupled to the metal plug 1004. Thus, the source 1010 can be accessible to the topside of the substrate 1000 through the metal plug 1004 used as a connection.

The substrate of the C-SST can be a p-type bulk silicon material or some other substrate material. The drain 1001 and source 1010 can be $N^+$ doped regions if the substrate 1000 is a p-type material. In another embodiment, the drain 1001 and source 1010 can be p-type material if the substrate 1000 is an n-type material.

Figure 11H:
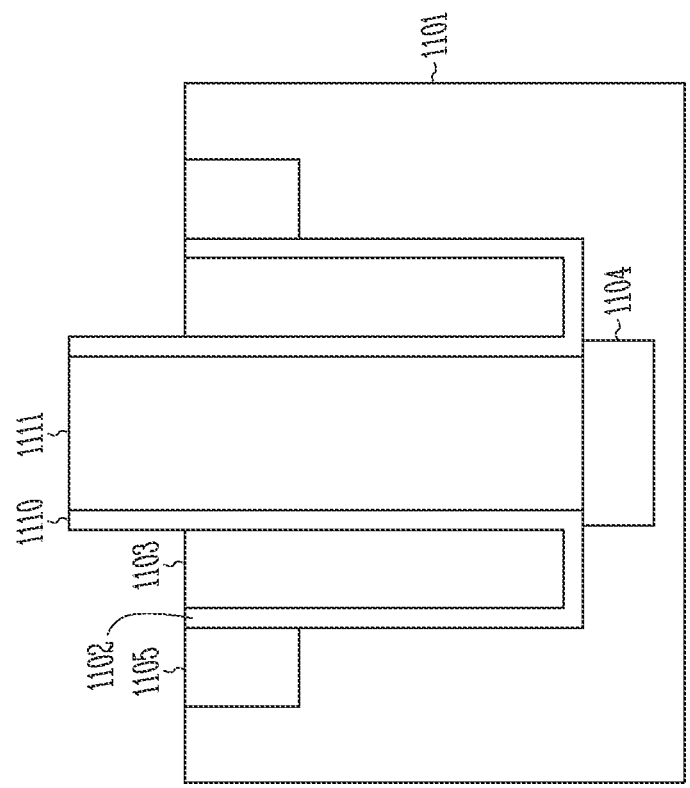

FIGS. 11A-11H illustrate an embodiment of a fabrication process for forming the C-SST of FIGS. 10A and 10B. FIGS. 11A and 11B illustrate top and cross-sectional views, respectively, of an opening 1100 formed in a substrate 1101. An X-X' axis is shown bisecting the opening 1100 and is used for illustrating cross-sectional views of subsequent steps of the fabrication process. For example, FIGS. 11B, 11D, 11F, and 11H illustrate cross-sectional views of the process along the X-X' axis.

FIGS. 11C and 11D illustrate top and cross-sectional views, respectively, of the opening 1100 after the gate insulator 1102 (e.g., oxide, $SiO_2$) is formed lining the opening 1100. The control gate material 1103 (e.g., polysilicon, metal) is formed within the gate insulator 1102 such that 1103 is surrounded by 1102.

FIGS. 11E and 11F illustrate top and cross-sectional views, respectively, after the drain 1105 has been doped in an annular fashion in the substrate 1101 around the outer perimeter of the gate insulator 1102. An opening 1106 has been formed in the control gate material 1103. The source 1104 is doped into the substrate 1101 at the bottom of the opening 1106.

Figure 11G:
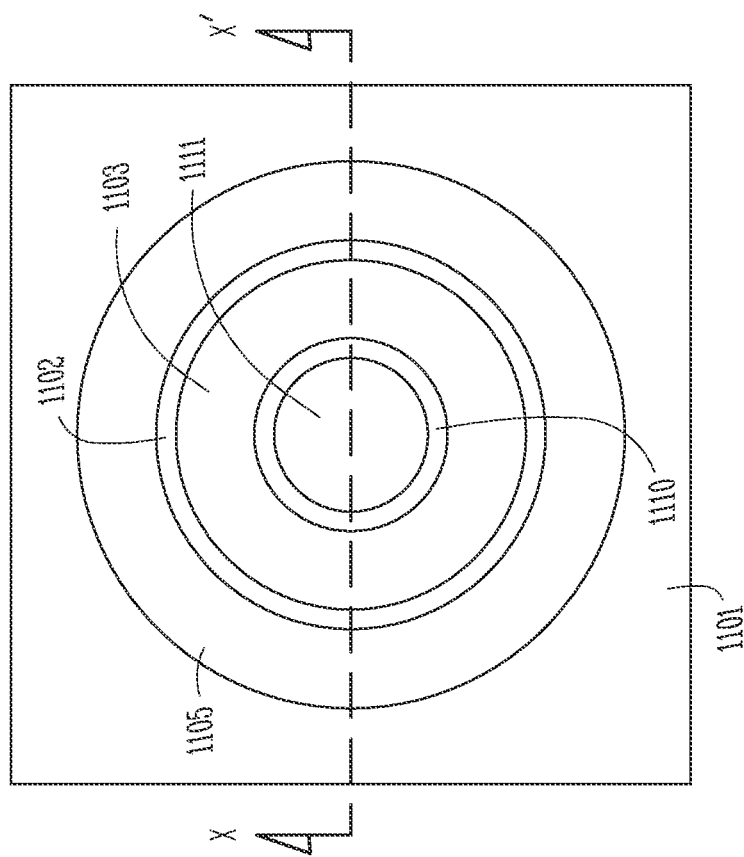

FIGS. 11G and 11H illustrate top and cross-sectional views, respectively, after the sides of the opening in the gate material 1103 have been lined with an electrically insulative material (e.g., oxide, SiO2) 1110. The bottom of the opening 1106 over the source 1104 is free from the electrically insulative material 1110. The metal plug 1111 is then formed in the opening 1106 such that it is in contact with the source 1104 and extends above the topside surface of the substrate 1101. The electrically insulative material 1110 can also extend above the topside surface of the substrate 1101 and substantially wrap around the extended outer surface of the metal plug 1111.

FIGS. 12A-12F illustrate another embodiment of a C-SST. This C-SST can be a ring-type C-SST where the source can be formed on the topside surface such that the metal plug of the previous embodiment is no longer needed.

FIGS. 12A and 12B illustrate top and cross-sectional views, respectively, after an annular ring opening 1201 is formed into the substrate 1200. The annular ring opening 1201 leaves a center pillar 1220 of the substrate material extending to the topside of the substrate 1200.

FIGS. 12C and 12D illustrate top and cross-sectional views, respectively, after the annular ring 1201 has been lined with the gate insulator 1203 (e.g., oxide, SiO2). The annular ring 1201 within the gate insulator 1203 can then be filled with the gate material 1204 (e.g., metal, polysilicon).

FIGS. 12E and 12F illustrate top and cross-sectional views, respectively, after the drain 1210 has been doped in an annular fashion on the topside surface of the substrate 1200 around the annular ring 1201. The source 1211 can be doped in the top of the substrate pillar 1220 in the center of the annular ring 1201. The drain 1210 and source 1211 can be n-type areas when the substrate is a p-type material. In another embodiment, the drain 1210 and source 1211 can be p-type areas when the substrate is an n-type material.

FIG. 13 illustrates an embodiment of the C-SST 1400 as incorporated into an embodiment of the apparatus of FIG. 3. In the illustrated embodiment, the C-SST 1300 can be used as a driver transistor (e.g., HV-Driver) for the select gates 1311 (e.g., select gate drain) used with the strings of memory cells 1312. The C-SST 1300 has been formed into the substrate 1301 such that the source is accessible to the plurality of strings of memory cells 1312 formed on the topside of the substrate 1301. In the illustrated embodiment, the source of the C-SST 1300 is accessible through the metal plug as in the embodiment of FIGS. 10A and 10B. Another embodiment might use the C-SST embodiment of FIGS. 12A-12F.

The embodiment of FIG. 13 shows a plurality of pillars 1310 that can be coupled to additional driver transistors (not shown) in substantially the same manner as the C-SST 1300 is shown coupled to the select gates 1311. These pillars 1310 can be used to couple the driver transistors to memory cell control gates and other select gates (e.g., source select gates). This figure also shows the data lines 1313 coupled to the strings of memory cells through data line contacts 1314.

FIGS. 14A-14D illustrate potential uses of the surround substrate transistors (SSTs) of the embodiments of FIGS. 6 and 8, such as where the threshold voltage $V_{th}$ of an SST 1452 can be modulated by neighboring SST's 1450, 1451 (e.g., assist gates). Such an embodiment can be used in the apparatus of FIG. 3 as data line clamp transistors. During a pre-charging operation of the data line, the threshold voltage $V_{th}$ of the data line clamp transistor could be modulated low. During a sense operation of the data line, the threshold voltage $V_{th}$ can be modulated high, such as for charge sharing sensing.

Figure 14C:
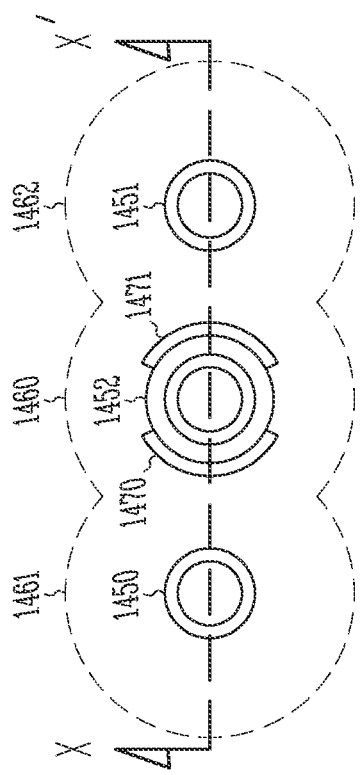
FIGS. 14A-14D illustrate top and cross-sectional operational views of surround substrate transistors using threshold voltage modulation.
Figure 14D:
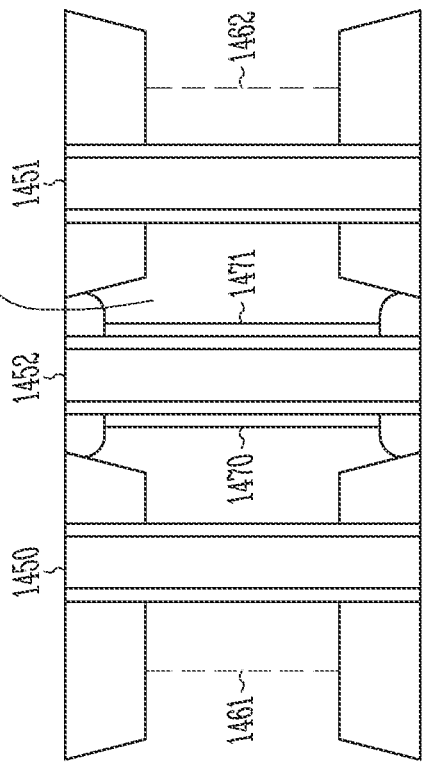
Figure 14A:
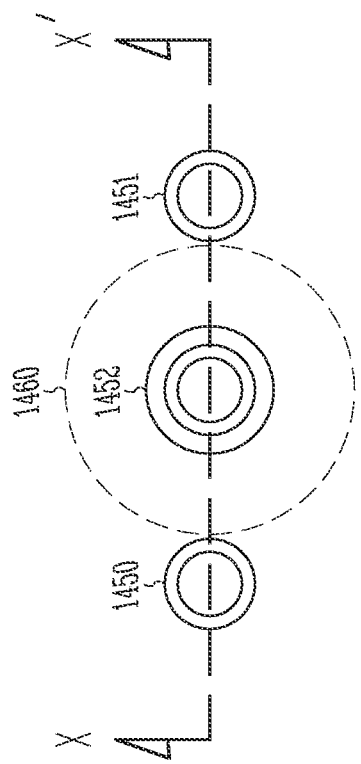
Figure 14B:
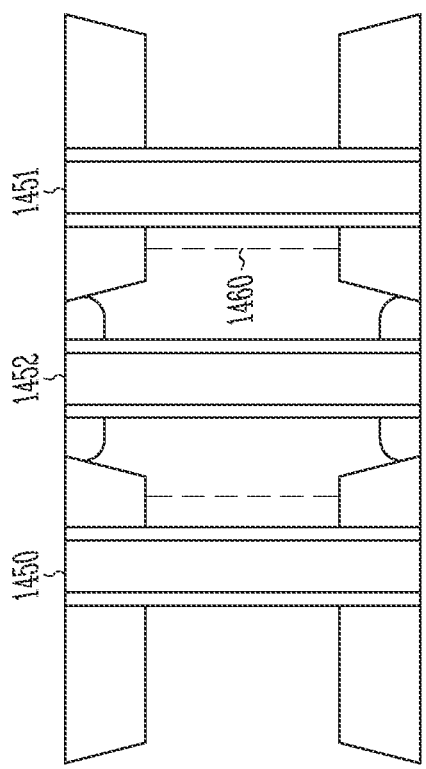

FIGS. 14A and 14C illustrate top operational views of the SSTs that use two assist gates 1450, 1451. FIGS. 14B and 14D illustrate cross-sectional operational views of the SSTs through the X-X' axis. In the illustrated embodiment, the assist gates 1450, 1451 do not have source/drain regions. This can result in a more compact layout area.

FIGS. 14A and 14B show the assist gates 1450, 1451 disabled (e.g., turned off). Thus, biasing of the center SST 1452 can use a higher threshold voltage $V_{th}$ to create the depletion region 1460 around the center SST 1452. FIGS. 14C and 14D show the assist gates 1450, 1451 enabled (e.g., turned on) by proper biasing. The depletion regions 1461, 1462 of the assist gates 1450, 1451 can be fully depleted regions 1470, 1471, respectively, around the center SST 1452 such that a lower threshold voltage $V_{th}$ can be used on the center SST 1452.

Figure 15:
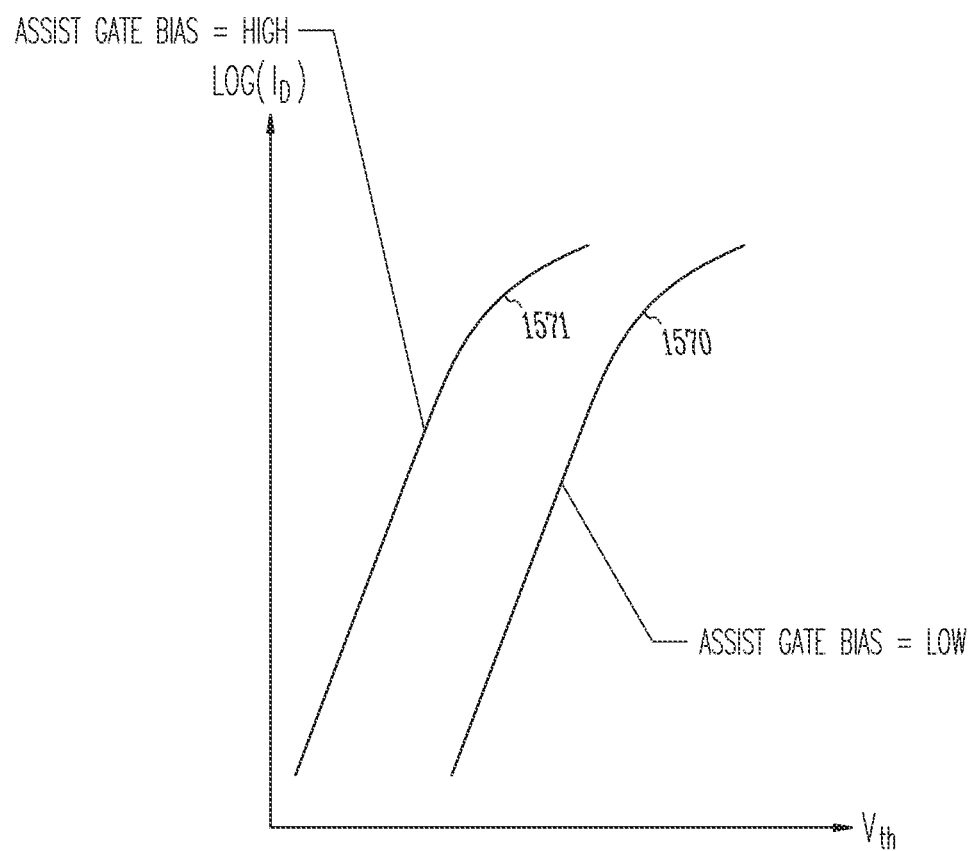
FIG. 15 illustrates a plot of logarithmic drain current versus threshold voltage in accordance with the embodiment of FIGS. 14A-14D.

FIG. 15 illustrates a logarithmic plot of drain current $\log(I_D)$ along the y-axis versus threshold voltage $V_{th}$ along the x-axis using data generated from silicon. This graph shows plots 1570, 1571 of $\log(I_D)$ versus $V_{th}$ for when the assist gates are disabled (e.g., bias=low) and when the assist gates are enabled (e.g., bias=high), respectively. It can be seen that the threshold voltage can be reduced when the assist gates are enabled.

Figure 16:
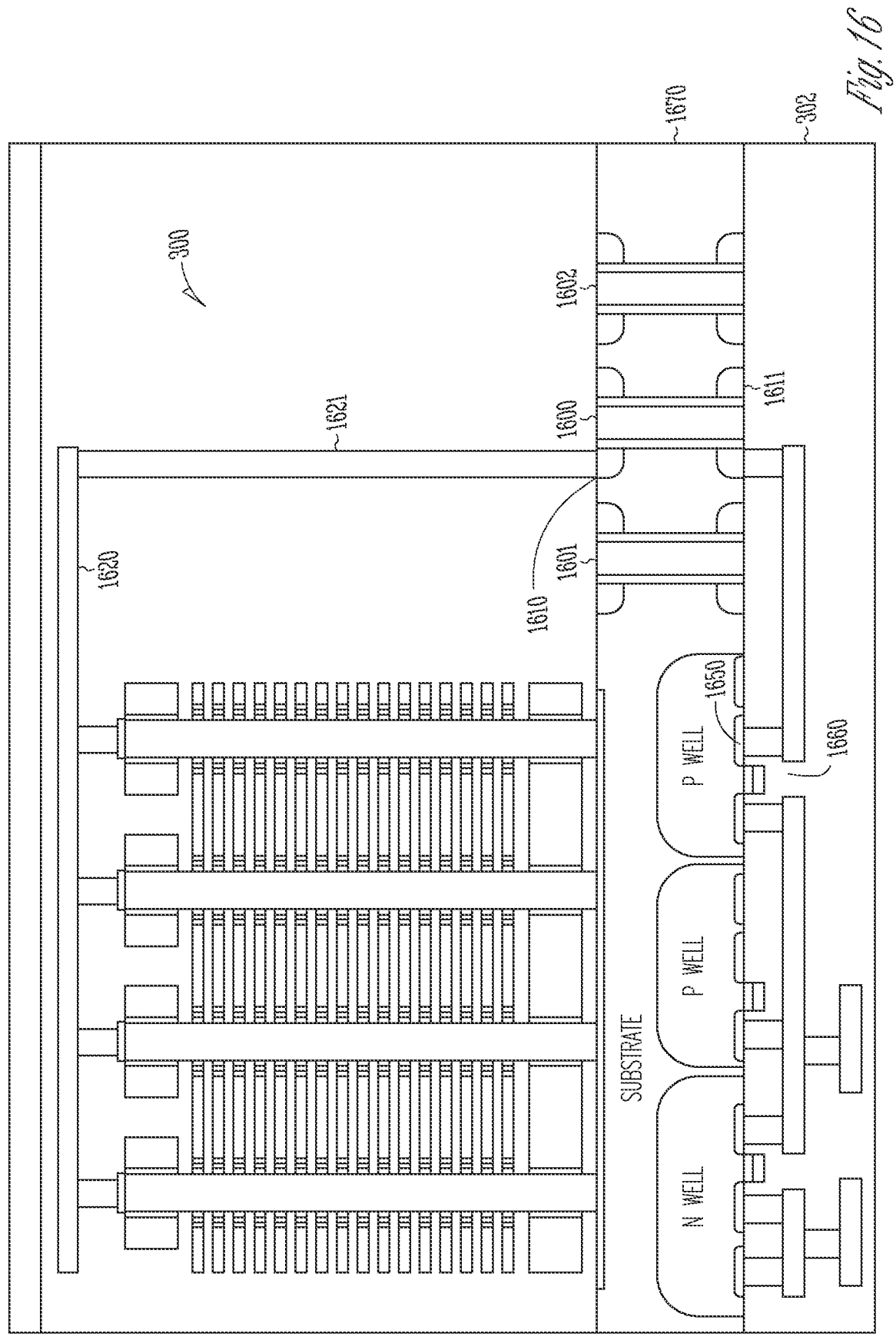
FIG. 16 illustrates a cross-sectional view of an embodiment of an apparatus including a plurality of semiconductor pillars and that incorporates threshold voltage modulation with surround substrate transistors.

FIG. 16 illustrates a cross-sectional view of an embodiment of the apparatus of FIG. 3 that can incorporate the embodiments of FIGS. 14A-14D. The illustrated embodiment of FIG. 16 can use the threshold voltage $V_{th}$ modulation for the data line clamp transistor for data line pre-charge and sense operations.

FIG. 16 shows the data line clamp SST 1600 with its two assist gates 1601, 1602. Alternate embodiment may use more or less numbers of assist gates. One of the drain/source regions 1610 of the data line clamp SST 1600 can be coupled to a data line 1620 by a conductor 1621. The other drain/source region 1611 of the data line clamp SST 1600 can be coupled to a drain/source region 1650 of a page buffer driver transistor 1660. It can be seen that the data line clamp SST 1600 can be used as a vertical interconnect in the substrate 1670, such as to selectively couple the page buffer driver 1660, that is part of the backside circuitry 302, to the topside plurality of strings of memory cells 300.

The embodiment of FIG. 16 is for purposes of illustration only. The SSTs as disclosed herein can have other uses besides those illustrated in FIG. 16. For example, an SST can be used as a transfer gate in a charge pump circuit as illustrated in FIG. 17.

Figure 17:
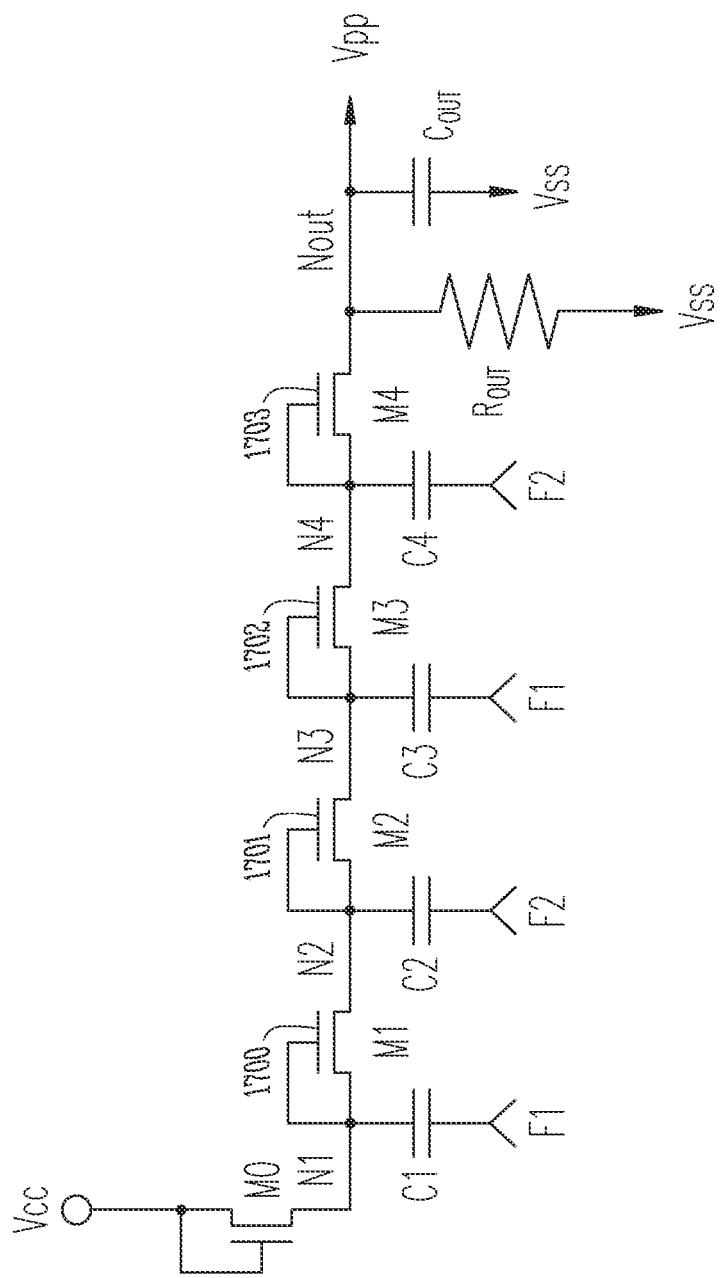
FIG. 17 illustrates a schematic diagram of an embodiment of a charge pump circuit incorporating surround substrate transistors as transfer gates.

FIG. 17 shows a schematic diagram of an embodiment of a charge pump circuit using an SST 1700-1703 as transfer gates. Using the assist gate embodiment of FIG. 9A-9C, a lower threshold voltage $V_{th}$ can be achieved as compared to a typical prior art charge pump transfer gate. This can result in relatively higher efficiency and lower power than typical prior art charge pumps.

Figure 18A:
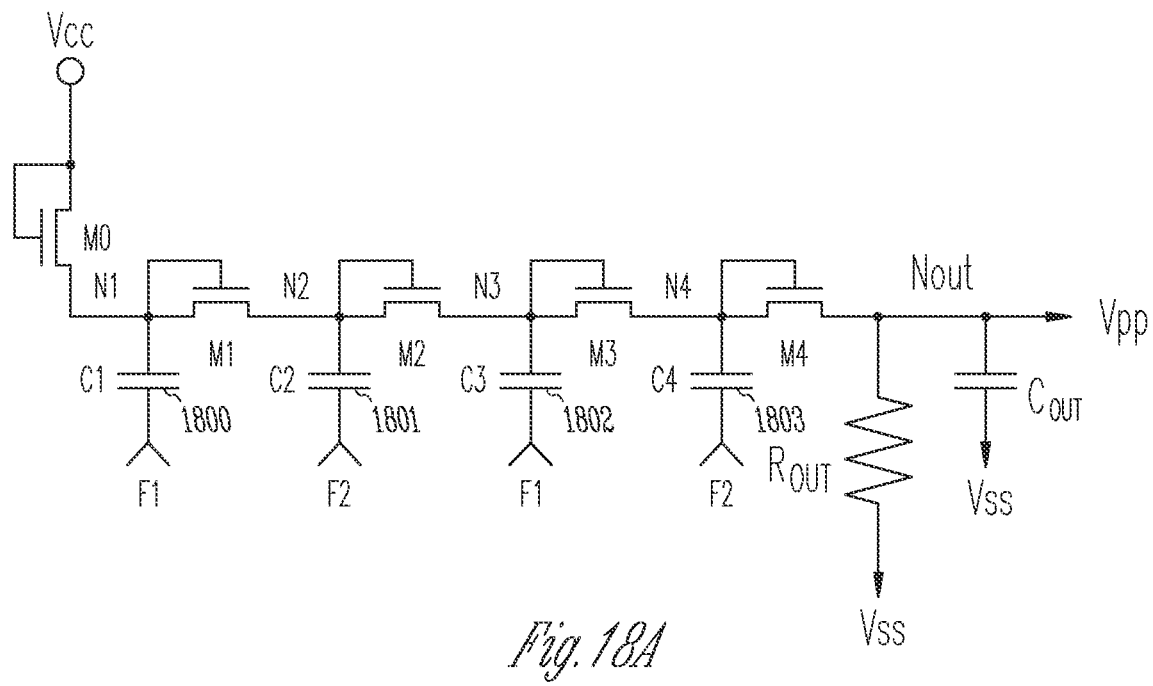
FIGS. 18A and 18B illustrate a schematic diagram of a charge pump circuit and an isometric depiction of surround substrate transistors as capacitors.
Figure 18B:
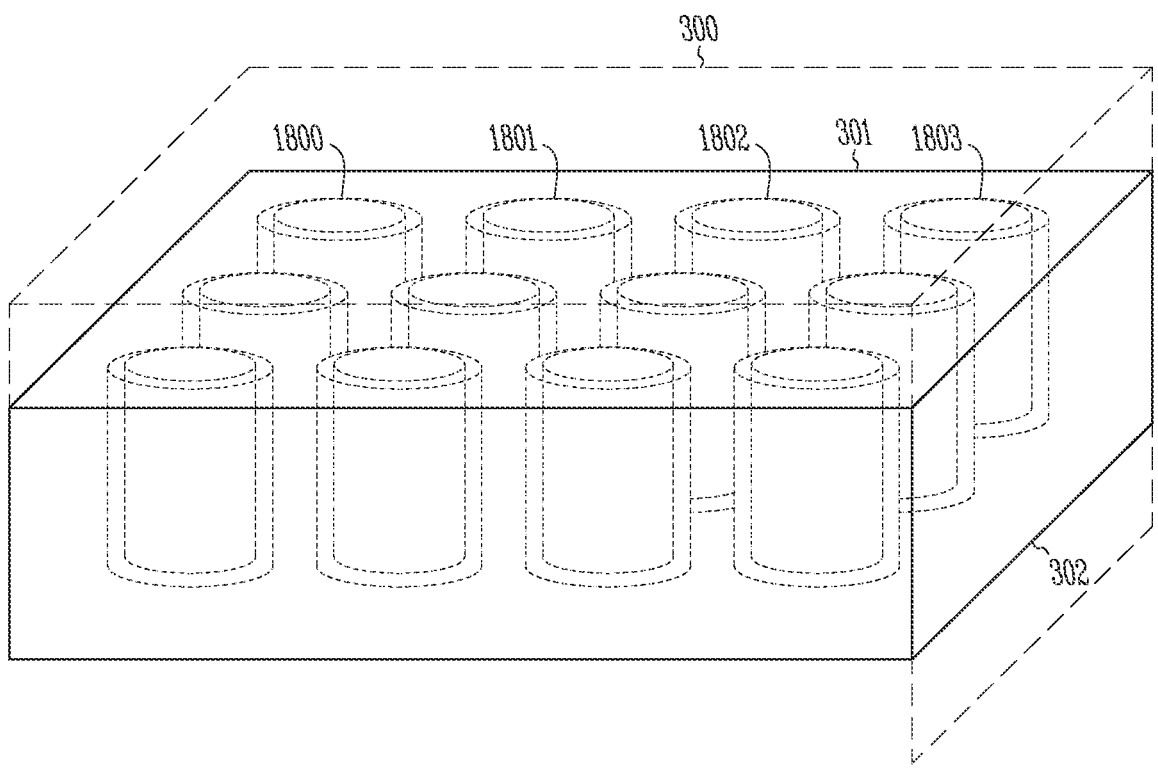

FIGS. 18A and 18B illustrate yet another embodiment of the SSTs. FIG. 18A shows a schematic diagram of the charge pump where the SSTs 1800-1803 can be used as capacitors. Also, the SSTs can be used as the diode connected transistors M0-M4. In the embodiment of FIG. 18B, the capacitors 1800-1803 and the diode connected transistors M0-M4 are SSTs formed in the substrate 301.

FIGS. 19A-19G illustrate a process flow for forming a surround gate transistor (SGT) in a substrate, such as a substrate for the apparatus of FIG. 3. The SGTs are formed such that their contacts are accessible through the topside of the substrate 1900 in order to be coupled to the plurality of strings of memory cells in subsequent steps. The resulting transistors can be used as relatively high voltage (e.g., approximately 15-20V) surround gate transistors (HV-SGT) for program and erase voltages that can have relatively reduced real estate as compared to typical prior art SGTs.

Figure 19A:
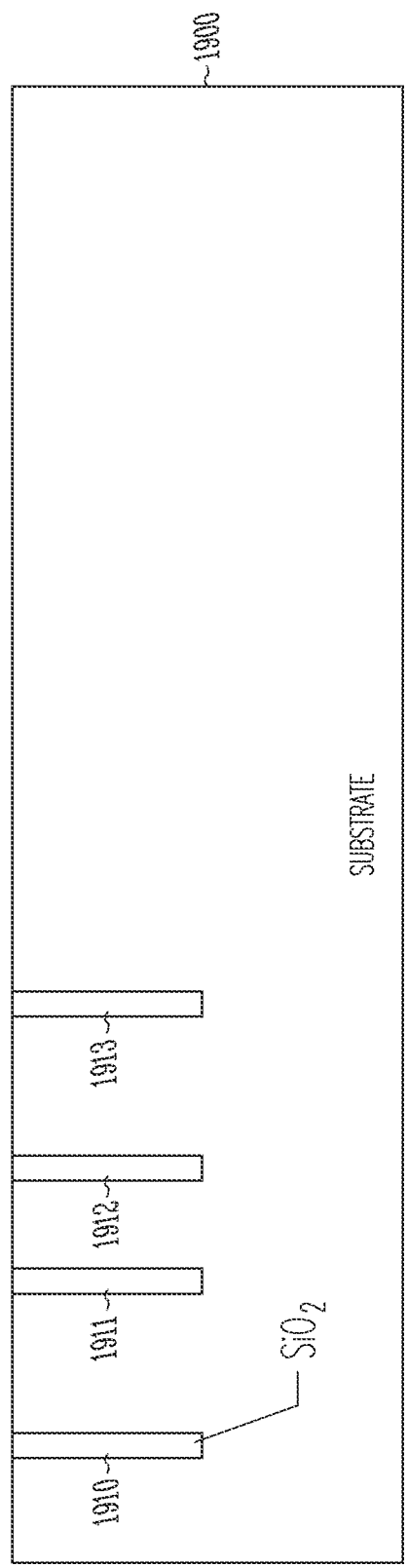
FIGS. 19A-19G illustrate an embodiment of a method for forming surround gate transistors in a substrate.
Figure 19B:
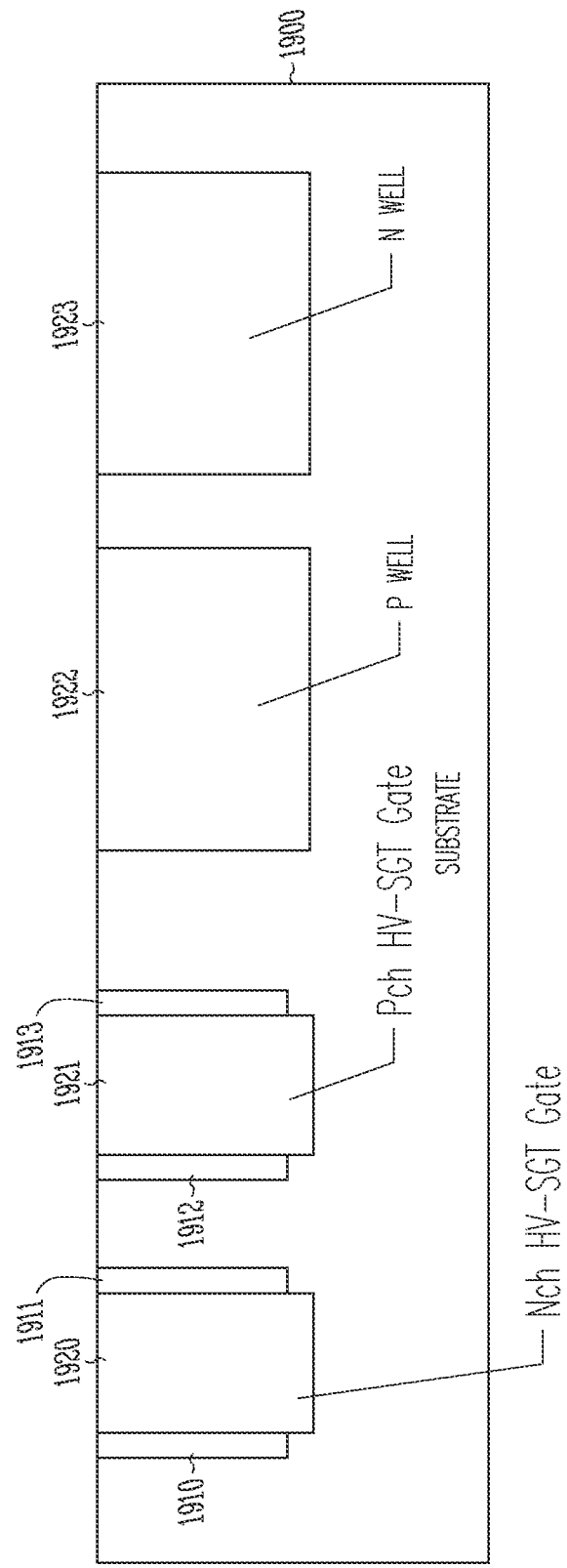

As shown in FIG. 19A, the process can create trench isolation in the substrate 1900 by forming a plurality of openings (e.g., trenches 1910-1913) that can be filled with an electrically insulative material (e.g., oxide, $SiO_2$). FIG. 19B shows various ion implantation and diffusion regions 1920-1923 formed in the substrate 1900. For example, between the first two isolation trenches 1910, 1911, an n-channel HV-SGT gate 1920 can be formed. Between the second two isolation trenches 1912, 1913, a p-channel HV-SGT gate 1921 can be formed. A p-well 1922 can be formed in one area for additional circuitry while an n-well 1923 can be formed in another area for additional circuitry.

Figure 19C:
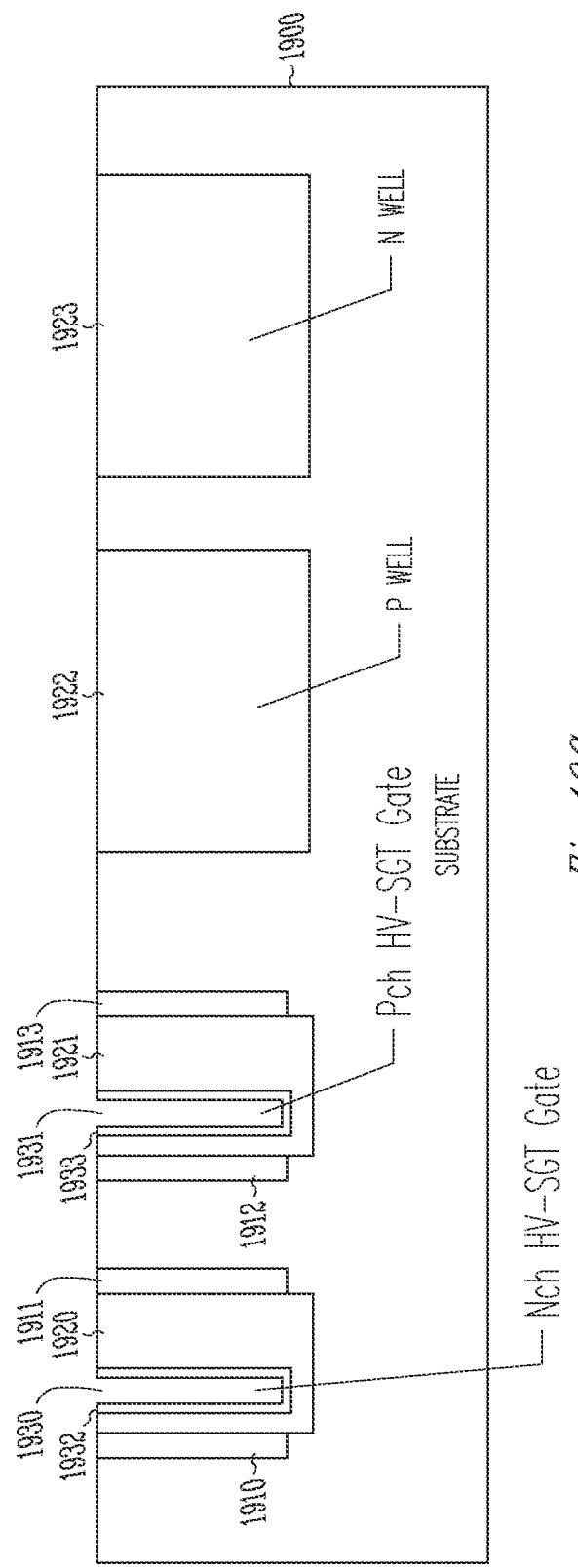

FIG. 19C shows an opening (e.g., trench 1930) formed in the n-channel gate 1920 and an opening (e.g., trench 1931) formed in the p-channel gate 1921. The trenches 1930, 1931 can be lined with an electrically insulative material 1932, 1933 (e.g., oxide, $SiO_2$), respectively.

Figure 19D:
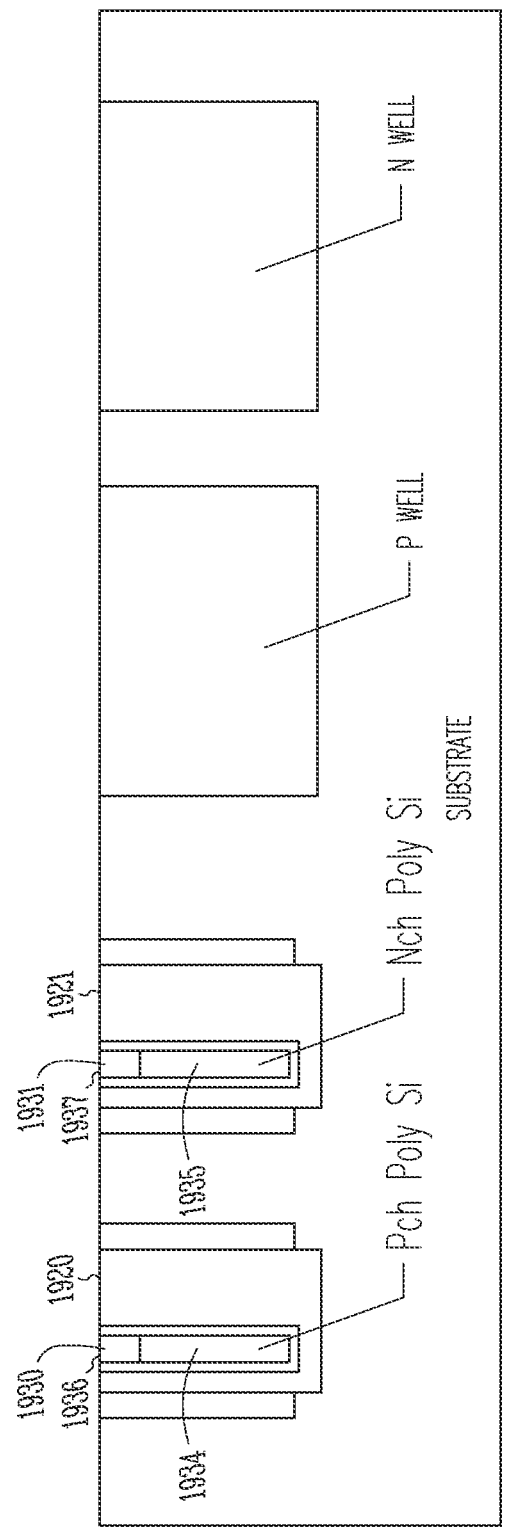

FIG. 19D shows the insulator-lined trenches 1930, 1931 filled with a semiconductor material (e.g., polysilicon) having the opposite conductivity of the gate in which it is formed. In other words, the trench 1930 in the n-channel gate 1920 can be filled with a p-doped semiconductor material 1934 while the trench 1931 in the p-channel gate 1921 can be filled with an n-doped semiconductor material 1935. The semiconductor material 1934, 1935 can eventually act as a channel region for each HV-SGT. Sources 1936, 1937 (e.g., $n^+$ and $p^+$, respectively) can then be formed in the top portions of their respective semiconductor material 1934, 1935.

Figure 19E:
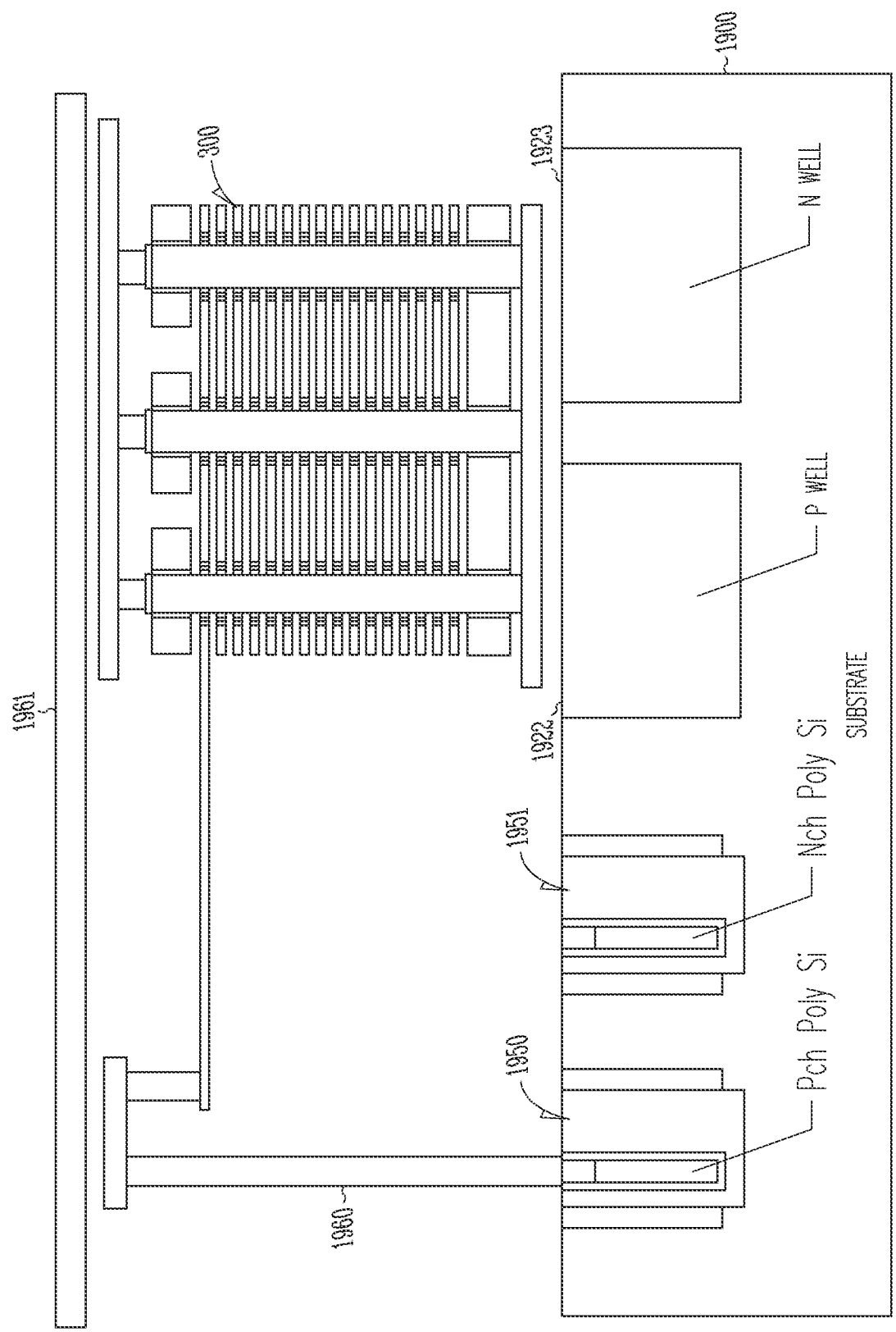

FIG. 19E shows the resulting HV-SGTs 1950, 1951 formed in the substrate 1900. The plurality of strings of memory cells 300 can be formed over the substrate 1900. In this case, the plurality of strings of memory cells 300 can be formed over the p-well 1922 and n-well 1923. One of the HV-SGTs 1950 can be coupled through a conductor 1960 to the plurality of strings of memory cells 300 to be used as a driver transistor (e.g., control gate driver). A mechanical support 1961 can be formed over the plurality of strings of memory cells 30). As in previous embodiments, the mechanical support 1961 can be temporary or permanent.

Figure 19F:
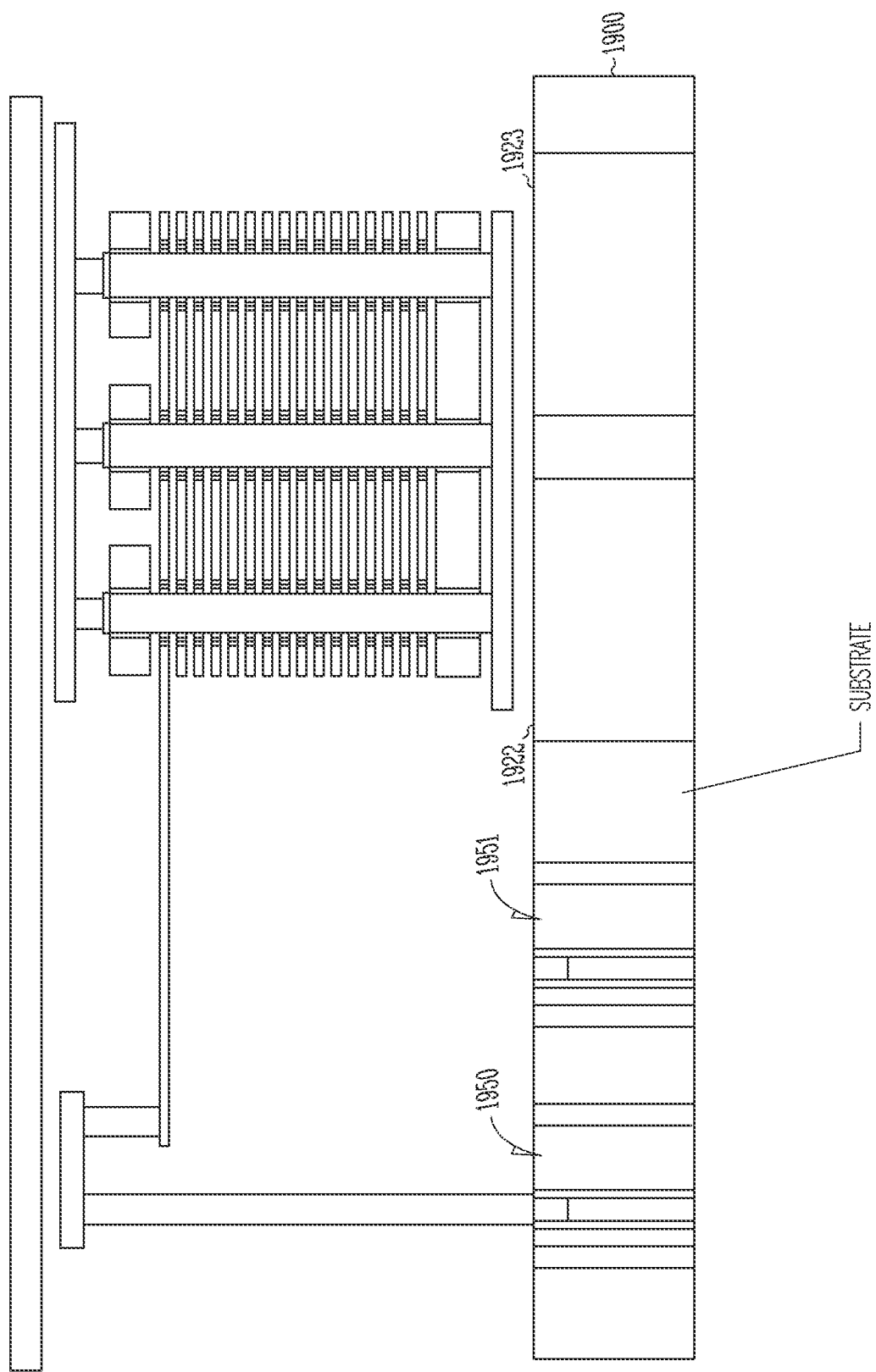

FIG. 19F shows the result of a grinding process that removes a portion of the substrate 1900. This process exposes the backsides of the HV-SGTs 1950, 1951 as well as the p-well 1922 and n-well 1923. In an embodiment, the substrate 1900 can be reduced to approximately 2 µm. Other embodiments can use other thicknesses.

Figure 19G:
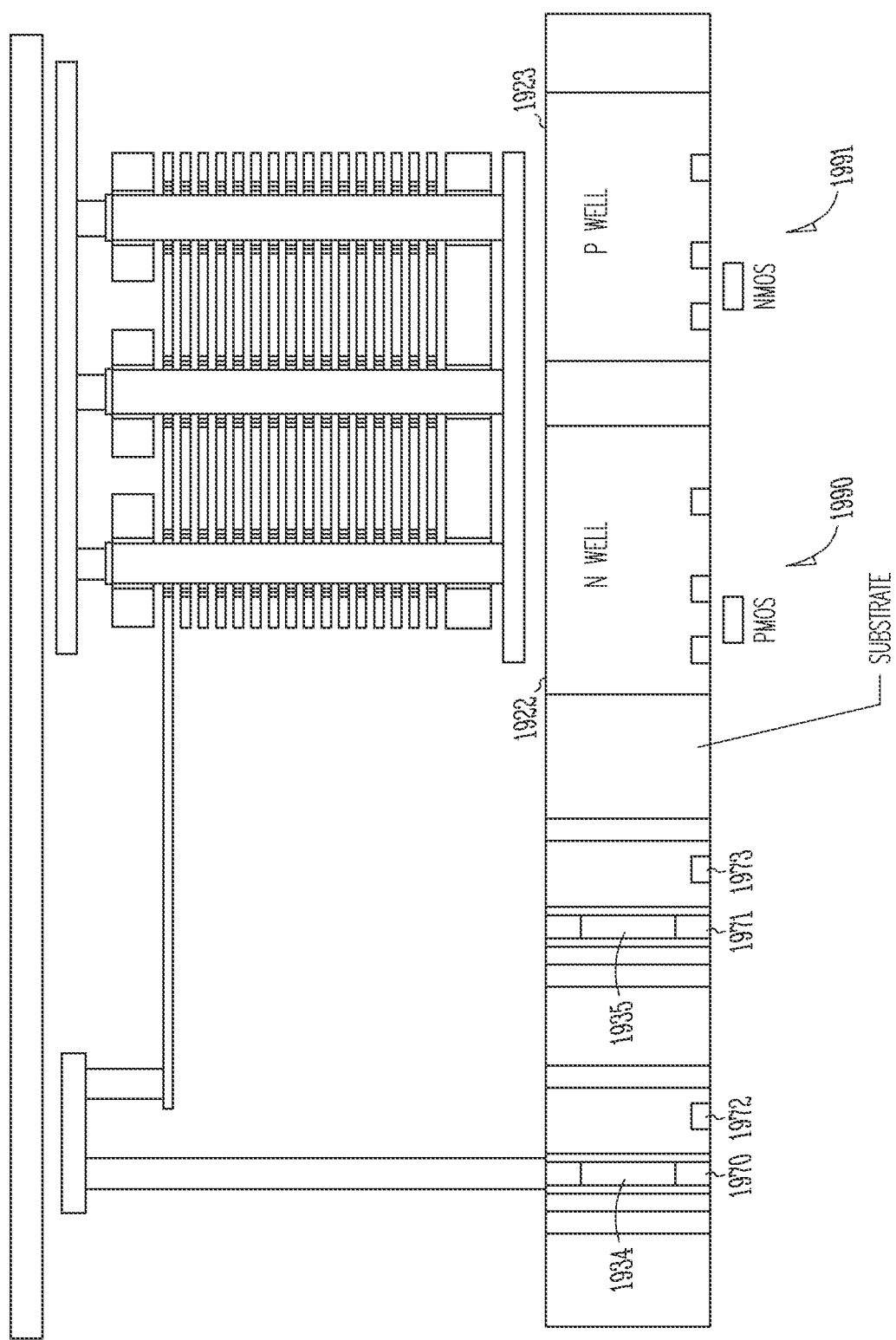

FIG. 19G shows drains 1970, 1971 (e.g., n+ and p+, respectively) can be formed in the exposed ends of the semiconductor material 1934, 1935 of their respective HV-SGT 1950, 1951. Gate contacts 1972, 1973 (e.g., p+ and n+, respectively) can also be formed, such as those which can be used to bias the gates 1920, 1921 of their respective HV-SGT 1950, 1951. Additional circuitry 1990, 1991 can be formed on the backside of the substrate 1900 that can be accessed through the respective wells 1922, 1923.

Figure 20:
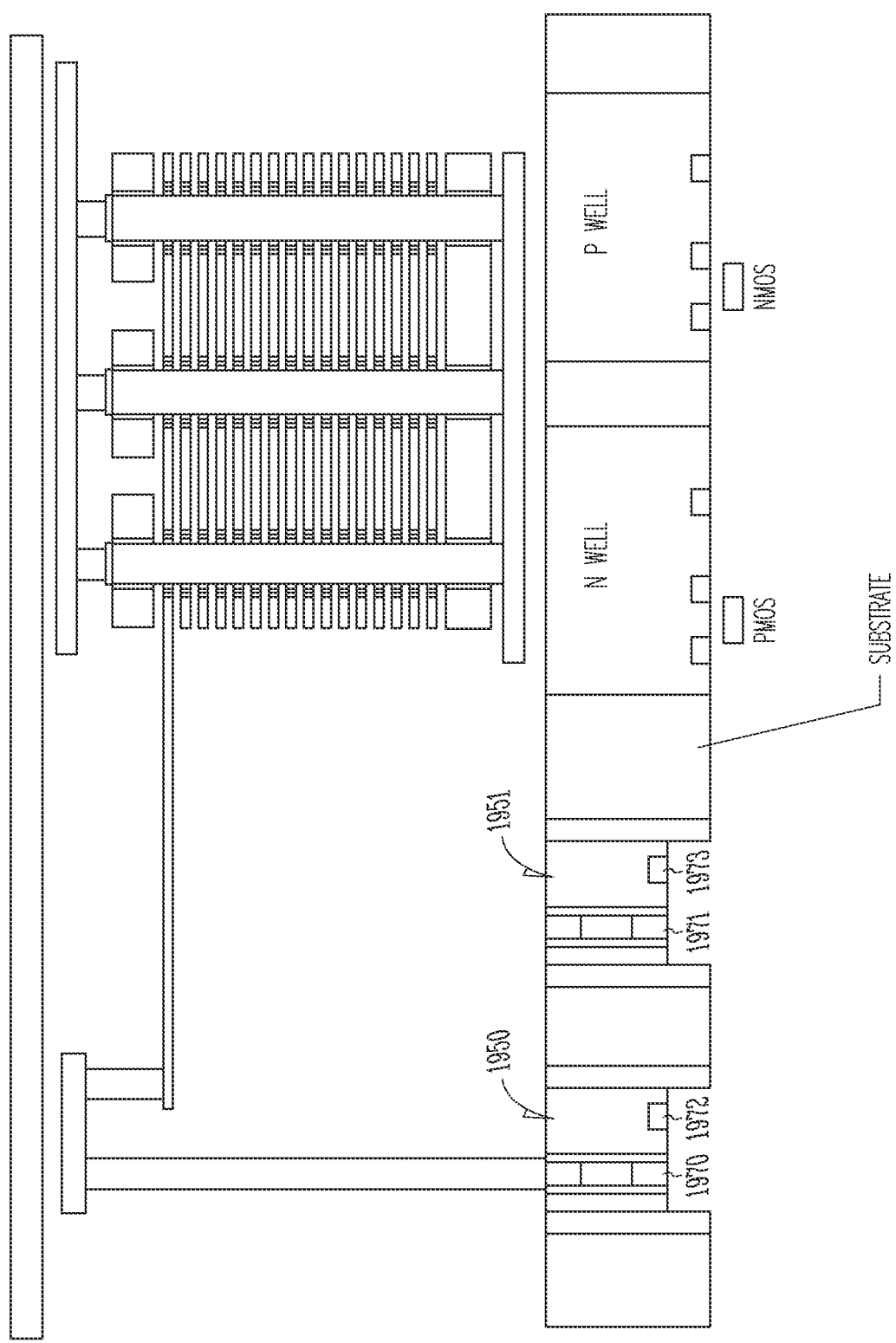
FIG. 20 illustrates a cross-sectional view of an embodiment of an apparatus incorporating the surround gate transistors in accordance with the embodiments of FIGS. 19A-19G.

FIG. 20 illustrates another embodiment of the HV-SGTs 1950, 1951 of FIGS. 19A-19G. In the embodiment of FIG. 20, an etch process (e.g., directional etch) can be used to shorten the channel region length prior to forming the backside drains 1970, 1971 and gate contacts 1972, 1973.

Figure 21:
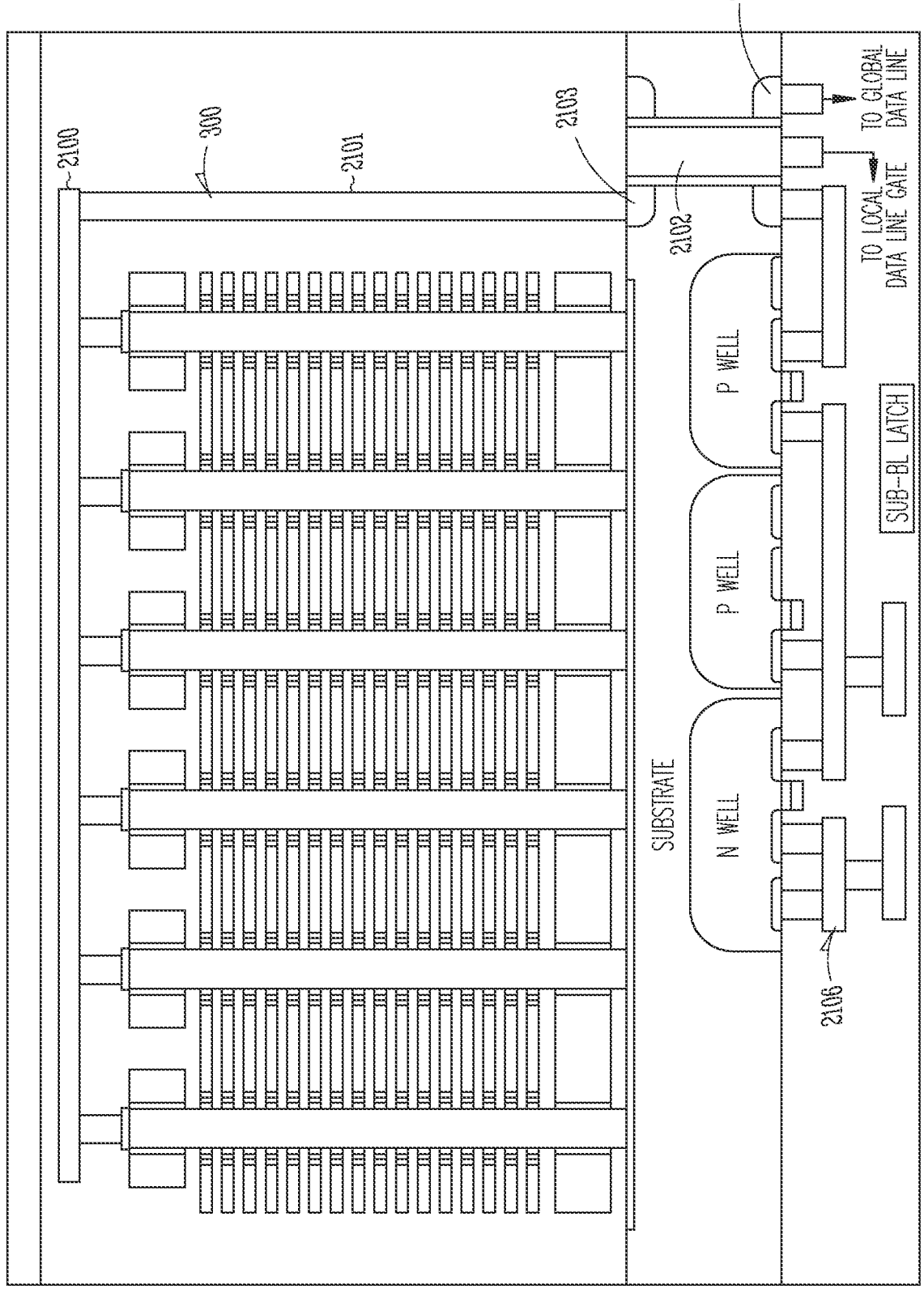
FIG. 21 illustrates a cross-sectional view of an embodiment of an apparatus incorporating data lines and access lines on both sides of a substrate in an apparatus.

FIG. 21 illustrates a cross-sectional view of an embodiment where the data lines and access lines can be located on both sides of the substrate instead of just on the topside with the plurality of strings of memory cells 300. FIG. 21 shows that a local data line 2100 is coupled to a transistor 2102 (e.g., HV-SST), serving as a vertical interconnect, through a conductor 2101 coupled to the transistor's topside source/drain 2103. The transistor's backside source/drain 2104 is coupled to both a global data line (not shown) and a local data line latch 2106.

Figure 22:
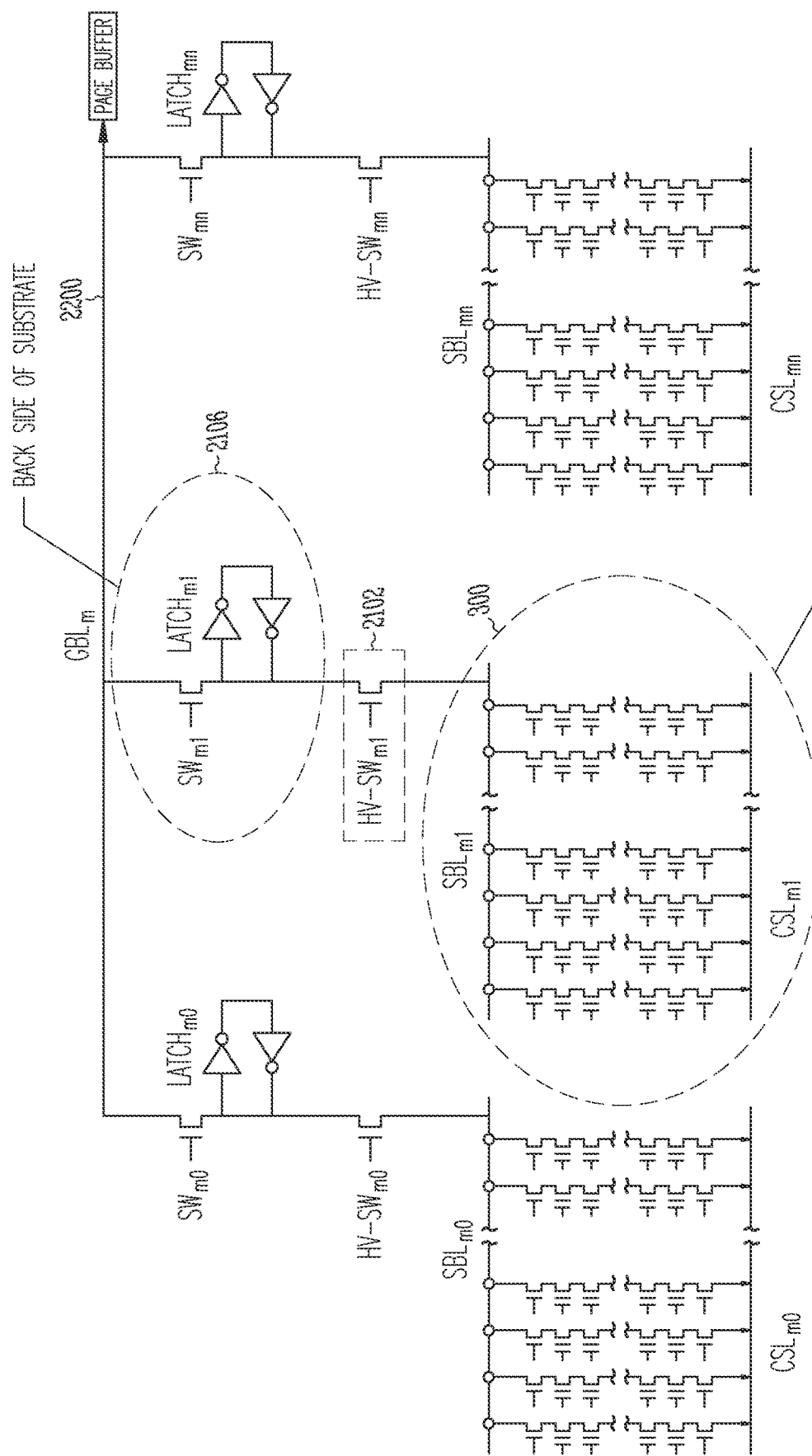
FIG. 22 illustrates a schematic diagram of an embodiment of the apparatus in accordance with the embodiment of FIG. 21.

FIG. 22 illustrates a schematic diagram of the cross-sectional view of FIG. 21. This view shows the global data line 2200 coupled to the local data line latch 2106 that is coupled to the plurality of strings of memory cells 300. The plurality of strings of memory cells 300 is on the topside of the substrate. The latch 2106 and the global data line 2200 are on the backside of the substrate. The latch 2106 on the backside of the substrate is coupled to the plurality of strings of memory cells by the HV-SST 2102 that is formed in the substrate. Such an embodiment can enable multi-page read and program operations as well as sharing a global data line with multiple local data lines in the same sub-array.

Figure 23:
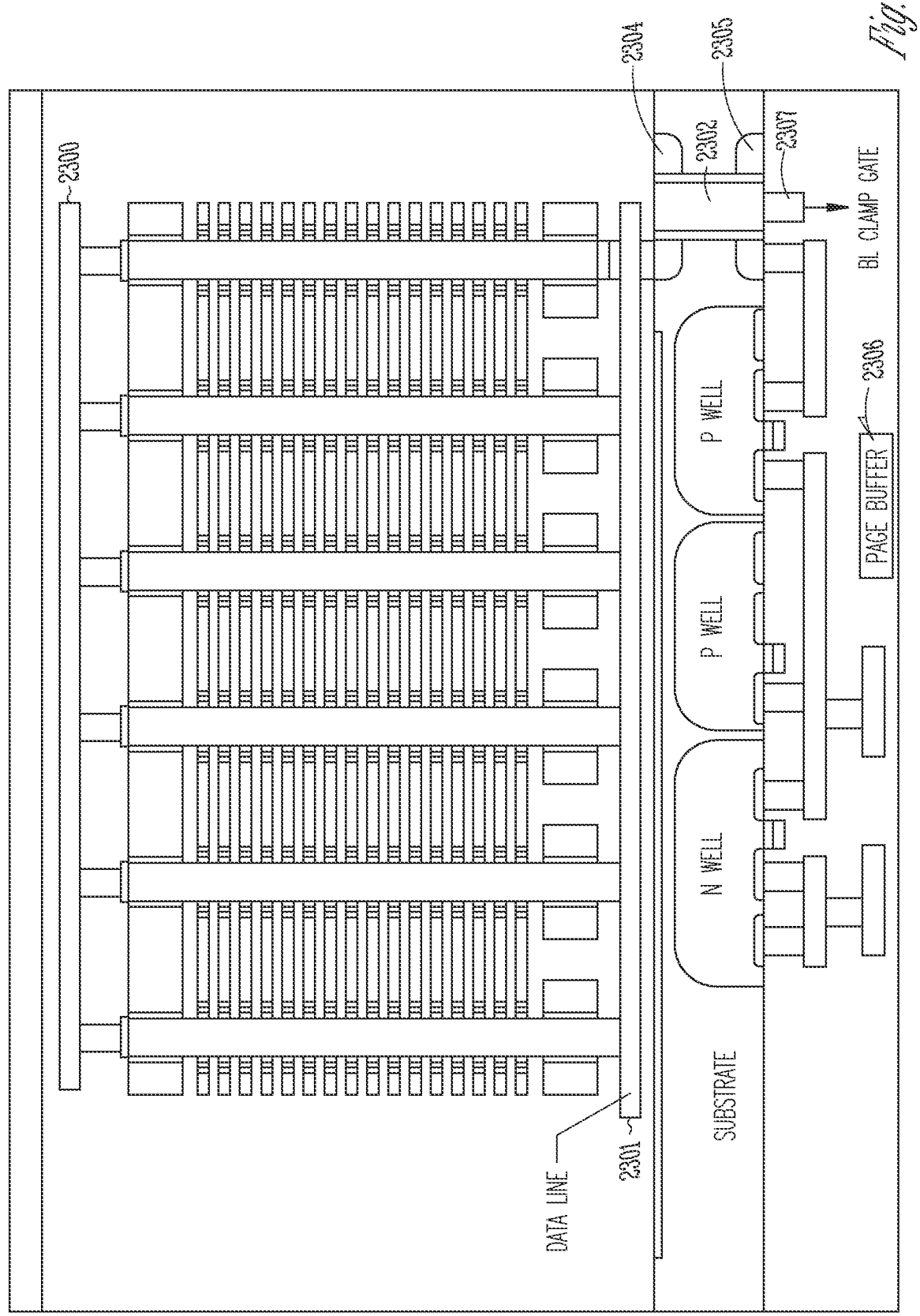
FIG. 23 illustrates a cross-sectional view of an embodiment of an apparatus having a data line on the bottom.

FIG. 23 illustrates a cross-sectional view of a plurality of strings of memory cells formed on the topside of the substrate having a bottom data line architecture. The source 2300 is shown on the top of the plurality of strings of memory cells furthest from the substrate while the data line 2301 is at the bottom of the plurality of strings of memory cells between the substrate and the plurality of strings of memory cells. The data lines are coupled to the topside source/drain region 2304 of the HV-SST 2302 formed in the substrate. The backside source/drain region 2305 is coupled to page buffer circuitry 2306. The control gate of the HV-SST 2307 is coupled to a data line clamp gate (not shown).

An apparatus may be, for example, circuitry, an integrated circuit die, a memory device, a memory array, or a system including such circuitry, die, device, or array, among other structures.

CONCLUSION

One or more embodiments include an apparatus with support circuitry on the backside of a substrate, which can, for example, help reduce the thermal budget experienced by the support circuitry. This can allow the plurality of strings of memory cells to be formed first and then the support circuitry (e.g., CMOS), which can be more heat sensitive, can be formed on the backside of the substrate.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A memory structure, comprising:
   a memory array formed on a first surface of a substrate;
   support circuitry formed on a second surface of the substrate, the second surface of the substrate opposite the first surface of the substrate, the support circuitry comprising multiple transistors; and
   first and second substrate transistors formed in the substrate in association with a respective opening in the substrate, the first and second substrate transistors respectively including,
      a gate insulator lining the opening and defining a central insulator opening;
      a conductive material extending within the opening and within the insulator and forming a gate;
      a first annular diffusion region extending around the opening at the first surface of the substrate;
      a second annular diffusion region extending around the opening at the second surface of the substrate; and
      a shallow trench insulation (STI) region separating the first annular diffusion regions of the first and second substrate transistors from one another at the first surface of the substrate.

2. The memory structure of claim 1, further comprising a second STI region separating the second annular diffusion regions of the first and second transistors from one another at the second surface of the substrate.

3. The memory structure of claim 1, wherein the second substrate transistor is placed and configured to generate, when biased, a depletion region extending toward the first substrate transistor.

4. The memory structure of claim 1, wherein the second substrate transistor is spaced at a first distance from the first substrate transistor; and
   wherein the memory structure further comprises third, fourth, and fifth substrate transistors also spaced at the first distance from the first substrate transistor, wherein the third, fourth, and fifth substrate transistors each include:
      a gate insulator lining the opening and defining a central insulator opening;
      a conductive material extending within the opening and within the insulator and forming a gate;
      a first annular diffusion region extending around the opening at the first surface of the substrate;
      a second annular diffusion region extending around the opening at the second surface of the substrate; and
      a shallow trench insulation (STI) region separating the first annular diffusion regions of the first and second substrate transistors from one another at the first surface of the substrate.

5. The memory structure of claim 4, wherein the third, fourth, and fifth substrate transistors are configured to further generate, when biased, depletion regions extending toward the first transistor.

6. The memory structure of claim 5, wherein second, third, fourth, and fifth substrate transistors are arranged relative to the first transistor to facilitate the depletion regions, when formed, causing a reduced voltage threshold Vth for the first substrate transistor.

7. A memory apparatus, comprising:
a memory array formed on a first surface of a substrate;
support circuitry formed on a second surface of the substrate, the second surface of the substrate opposite the first surface of the substrate, the support circuitry comprising a surround gate transistor (SGT) in association with a respective opening in the substrate, the SGT comprising:
one or more substrate openings in the substrate and containing an insulator material;
a diffusion region in the substrate and isolated by the insulator material, wherein the diffusion region is doped to form a first polarity semiconductor gate material of the SGT;
an opening in the gate material lined with a dielectric, forming a dielectric opening, and
a semiconductor channel material extending within the dielectric opening, the semiconductor channel material doped to form an opposite polarity semiconductor from the gate material, wherein opposite ends of the semiconductor channel material form source/drain regions of the SGT.

8. The memory apparatus of claim 7, further comprising a source contact formed within the dielectric opening at a first end of the semiconductor channel material; and a drain contact formed within the dielectric opening at a second, opposite, end of the semiconductor channel material.

9. The memory apparatus of claim 8, wherein the source contact at the first end of the semiconductor channel material extends to the first surface of the substrate; and wherein the drain contact at the second end of the semiconductor channel material extends to a second surface of the substrate, opposite the first surface.

10. The memory apparatus of claim 7, further comprising a gate contact extending to the semiconductor gate material.

11. The memory apparatus of claim 7, wherein the SGT is configured as a relatively high voltage transistor for supplying at least one of program and erase voltages for the memory array.

12. The memory apparatus of claim 7, wherein the SGT is configured to act as a control gate driver, and is coupled to a tier of control gates of the memory array.

13. The memory apparatus of claim 9, wherein the second surface of the substrate is recessed relative to a third surface of the substrate, which is also opposite the first surface, but at a greater distance from the first surface than is the second surface.

14. A memory structure, comprising:
a memory array formed over a first surface of a substrate;
support circuitry formed over a second surface of the substrate, the second surface of the substrate opposite the first surface of the substrate;
multiple substrate transistors formed in the substrate in association with respective openings in the substrate, the substrate transistors respectively including,
a conductive material extending within an opening in the substrate and defining an annular opening around the conductive material;
a gate insulator lining the annular opening and a conductive gate material extending within the opening and over the gate insulator to form a gate;
a first annular diffusion region extending around the opening at the first surface of the substrate to form a drain of the substrate transistor, the first annular diffusion region separated by a dielectric from the gate material; and
a second diffusion region beneath the conductive material, and separated from the gate material by the gate insulator, the second diffusion region forming a source of the substrate transistor.

15. The memory structure of claim 14, wherein the dielectric separating the annular diffusion region from the gate material is continuous with the gate insulator lining the annular opening.

16. The memory structure of claim 14, wherein the substrate transistor is coupled to select gates in a first tier of the memory array extending above the first surface to serve as a select gate driver.

17. A memory structure, comprising:
a memory array formed over a first surface of a substrate;
support circuitry formed over a second surface of the substrate, the second surface of the substrate opposite the first surface of the substrate; and
multiple substrate transistors formed in the substrate in association with respective openings in the substrate, the substrate transistors respectively including,
an annular control gate material extending within an annular opening in the substrate, the annular control gate material isolated from the substrate by a dielectric within the annular opening;
a first diffusion region in the substrate within a center region of the annular control gate material, the first diffusion region doped to an opposite polarity from the substrate to form a source region of the substrate transistor at the first surface of the substrate; and
a second annular diffusion region extending around the annular control gate material, the second annular diffusion region isolated from the control gate material by a dielectric, the second annular diffusion region doped to an opposite polarity from the substrate to form a drain region of the substrate transistor at the first surface of the substrate.

18. The memory structure of claim 17, wherein the annular opening in the substrate is lined with a dielectric, and wherein the dielectric lining isolates the annular control gate material from the first diffusion region, from the substrate, and from the second annular diffusion region.

19. The memory structure of claim 17, wherein one or more of the multiple substrate transistors controls operation of at least a portion of the memory array.

20. The memory structure of claim 17, further comprising through silicon vias (TSVs) connecting the support circuitry on the second surface of the substrate to structures of the memory array on the first surface of the substrate.

* * * * *